United States Patent
Yamazaki

(10) Patent No.: US 9,401,282 B2
(45) Date of Patent: Jul. 26, 2016

(54) METHOD OF MANUFACTURING SEMICONDUCTOR DEVICE, CLEANING METHOD, SUBSTRATE PROCESSING APPARATUS AND NON-TRANSITORY COMPUTER READABLE RECORDING MEDIUM

(71) Applicant: Hitachi Kokusai Electric Inc., Tokyo (JP)

(72) Inventor: Hirohisa Yamazaki, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 531 days.

(21) Appl. No.: 13/853,194

(22) Filed: Mar. 29, 2013

(65) Prior Publication Data
US 2013/0260566 A1 Oct. 3, 2013

(30) Foreign Application Priority Data

Mar. 30, 2012 (JP) ................................. 2012-082126
Feb. 28, 2013 (JP) ................................. 2013-039089

(51) Int. Cl.
| B08B 9/093 | (2006.01) |
| H01L 21/306 | (2006.01) |
| C23C 16/40 | (2006.01) |
| C23C 16/44 | (2006.01) |
| C23C 16/455 | (2006.01) |
| C23C 16/54 | (2006.01) |

(52) U.S. Cl.
CPC ............ *H01L 21/306* (2013.01); *C23C 16/405* (2013.01); *C23C 16/4405* (2013.01); *C23C 16/4408* (2013.01); *C23C 16/45546* (2013.01); *C23C 16/54* (2013.01)

(58) Field of Classification Search
None
See application file for complete search history.

(56) References Cited

U.S. PATENT DOCUMENTS

| 6,884,738 B2 | 4/2005 | Asai et al. |
| 2011/0290182 A1 | 12/2011 | Sakai et al. |

FOREIGN PATENT DOCUMENTS

| JP | 2003347298 | 12/2003 |
| JP | 2006339523 A | 12/2006 |

(Continued)

OTHER PUBLICATIONS

Office Action in corresponding Korean Application No. 10-2013-0031910, dated Feb. 28, 2014, along with an English translation.

*Primary Examiner* — Eric Golightly
(74) *Attorney, Agent, or Firm* — Edell, Shapiro & Finnan LLC

(57) ABSTRACT

Provided is a method of manufacturing a semiconductor device, which efficiently removes a high permittivity film (high-k film). The method of manufacturing a semiconductor device includes: (a) supplying a processing gas containing an organic compound into a process chamber to form a predetermined film on a substrate; (b) supplying a first cleaning gas into the process chamber with the substrate being unloaded from the process chamber to remove films adhered to an inner wall of a reaction tube defining the process chamber and members disposed in the process chamber; (c) supplying a modifying gas into the process chamber after performing (b) to modify a carbon-containing film remaining in a nozzle of the members configured to supply the processing gas; and (d) supplying a second cleaning gas into the process chamber to remove a film obtained by modifying the carbon-containing film in (c).

15 Claims, 15 Drawing Sheets

(56) References Cited

FOREIGN PATENT DOCUMENTS

| | | |
|---|---|---|
| JP | 2009188198 | 8/2009 |
| JP | 4560575 | 10/2010 |
| JP | 2011068984 | 4/2011 |
| JP | 2011068984 A | 4/2011 |
| KR | 1020060002807 A | 1/2006 |
| KR | 1020080039514 A | 5/2008 |
| KR | 1020110001918 A | 1/2011 |

COMPOSITION OF FILM ON INNER WALL
OF NOZZLE BEFORE GAS CLEANING

<Prior Art>

COMPOSITION OF FILM ON INNER WALL
OF NOZZLE AFTER MODIFICATION

<Prior Art>

<Prior Art>

<Prior Art>

<Prior Art>

FIG. 7

| | TEMAZr GAS FLOW 120sec | N₂ PURGE 20sec | EXHAUST 20sec | O₃ GAS FLOW 120sec | N₂ PURGE 10sec | EXHAUST 15sec |
|---|---|---|---|---|---|---|
| TEMAZr | 0.35g/min | | | 0g/min | | |
| N₂ (TEMAZr NOZZLE) | 8 slm | 5 slm | 0 slm | 2 slm | 4 slm | 0 slm |
| N₂ (Carrier) | 1 slm | | | | | |
| O₃ | | 0 slm | | 6 slm | 0 slm | |
| N₂ (TEMAZr NOZZLE) | 2 slm | 4 slm | | 0 slm | 4 slm | 0 slm |

FIG. 9

|  | O₂+H₂ GAS FLOW 120min | EXHAUST 10min |
|---|---|---|
| H₂ | 2 slm | 0 slm |
| O₂ | 2 slm | 0 slm |
| PRESSURE | 200 Pa | 10 Pa |

<Prior Art>

METHOD OF MANUFACTURING SEMICONDUCTOR DEVICE, CLEANING METHOD, SUBSTRATE PROCESSING APPARATUS AND NON-TRANSITORY COMPUTER READABLE RECORDING MEDIUM

CROSS REFERENCE TO RELATED APPLICATIONS

This application claims foreign priority under 35 U.S.C. §119(a)-(d) to Application No. JP 2012-082126 filed on Mar. 30, 2012, and to Application No. JP 2013-039089 filed on Feb. 28, 2013, the entire contents of each of which are hereby incorporated by reference.

FIELD OF THE INVENTION

The present invention relates to a method of manufacturing a semiconductor device including a process of processing a substrate, a cleaning method, a substrate processing apparatus, and a non-transitory computer readable recording medium.

BACKGROUND

A technique of forming a predetermined film, for example, a high permittivity film (high-k film), on a substrate includes a chemical vapor deposition (CVD) method. The CVD method is a method that forms a film, containing an element contained in a source molecule, on a substrate using reaction of two or more kinds of sources in a gas phase or a substrate surface. As the high-k film formed on the substrate, for example, there may be a zirconium dioxide film ($ZrO_2$ film), a hafnium dioxide ($HfO_2$ film), or the like. In this case, an organic metal material may be used as a source gas, and ozone ($O_3$), $H_2O$ (water), or the like may be used as an oxidizing gas (oxidative species) (refer to Patent Document 1, Japanese Patent Publication No. 4,560,575.

SUMMARY

The high-k film is formed by supplying a processing gas into a process chamber with a substrate loaded thereinto, but, when forming the high-k film, a deposit including the high-k film is adhered to a member such as an inner wall of a reaction tube configuring the process chamber, a substrate support in the process chamber, or an inner wall of a nozzle supplying a processing gas into the process chamber. When a film is thickly deposited in the process chamber, since a stress increases, the film can be cracked, and foreign materials (stripped extraneous materials) can be generated from the film. When the generated foreign materials are mixed into the high-k film on the substrate, a yield rate can be reduced. For this reason, whenever a film thickness of a film (deposited film) formed of a deposit reaches a predetermined thickness, it is required to remove the film, and for example, the deposit is removed by etching the process chamber with a cleaning gas without dismantling the process chamber. However, since the deposited film remains in each of the members including the inner wall of the nozzle despite gas cleaning, the etching cannot be sufficiently performed, and thus, it may be difficult to remove the deposited film.

Accordingly, the present invention is directed to provide a method of manufacturing a semiconductor device, a cleaning method, a substrate processing apparatus, and a non-transitory computer readable recording medium that efficiently remove a deposited film adhered to each of members in a process chamber.

According to an aspect of the present invention, there is provided a method of manufacturing a semiconductor device including: (a) supplying a processing gas containing an organic compound into a process chamber to form a predetermined film on a substrate; (b) supplying a first cleaning gas into the process chamber with the substrate being unloaded from the process chamber to remove films adhered to an inner wall of a reaction tube defining the process chamber and members disposed in the process chamber; (c) supplying a modifying gas into the process chamber after performing the step (b) to modify a carbon-containing film remaining in a nozzle of the members configured to supply the processing gas; and (d) supplying a second cleaning gas into the process chamber to remove a film obtained by modifying the carbon-containing film in the step (c).

According to another aspect of the present invention, there is provided a cleaning method of cleaning an inner wall of a reaction tube and members disposed in a process chamber of the reaction tube having a film containing an organic compound adhered thereto, the method including: (a) supplying a first cleaning gas into the process chamber to clean the inner wall of the reaction tube and the members; (b) supplying a modifying gas into the process chamber after performing the step (a) to modify a carbon-containing film remaining in a nozzle among the members configured to supply a processing gas; and (c) supplying a second cleaning gas into the process chamber to remove a film obtained by modifying the carbon-containing film in the step (b), thereby cleaning an inside of the process chamber.

According to still another aspect of the present invention, there is provided a substrate processing apparatus including: a reaction tube configured to form a process chamber processing a substrate; a processing gas supply system configured to supply a processing gas containing an organic compound into the process chamber; a cleaning gas supply system configured to supply a cleaning gas into the process chamber; a modifying gas supply system configured to supply a modifying gas into the process chamber; an exhaust system configured to exhaust the process chamber; and a control unit configured to control the processing gas supply system, the cleaning gas supply system, the modifying gas supply system, and the exhaust system to supply the processing gas containing the organic compound into the process chamber to form a film on the substrate, supply the cleaning gas into the process chamber to clean an inner wall of a reaction tube configuring the process chamber and a member disposed in the process chamber when the substrate is not disposed in the process chamber, supply the modifying gas into the process chamber to modify films remaining in a nozzle of the member disposed in the process chamber, and supply the cleaning gas into the process chamber to clean the inside of the nozzle.

According to yet another aspect of the present invention, there is provided a non-transitory computer readable recording medium storing a program that causes a computer to execute a process recipe including a film-forming step of supplying a processing gas containing an organic compound into a process chamber to form a predetermined film on a substrate, the program that causes the computer to execute a cleaning recipe including: a first cleaning step of supplying a first cleaning gas into the process chamber to clean an inner wall of a reaction tube and a member disposed in the process chamber; a modification step of supplying a modifying gas into the process chamber to modify, after the first cleaning step, films remaining in a nozzle of the member; and a second cleaning step of supplying a second cleaning gas into the process chamber to remove a film modified in the modification step.

BRIEF DESCRIPTION OF THE DRAWINGS

FIG. 7 is a view showing a sequence of a film-forming process according to an embodiment of the present invention;

FIG. 9 is a view showing a sequence of a modification process according to an embodiment of the present invention;

DETAILED DESCRIPTION

Hereinafter, a cleaning method according to an embodiment of the present invention will be described with reference to the accompanying drawings.

Figure 1A:
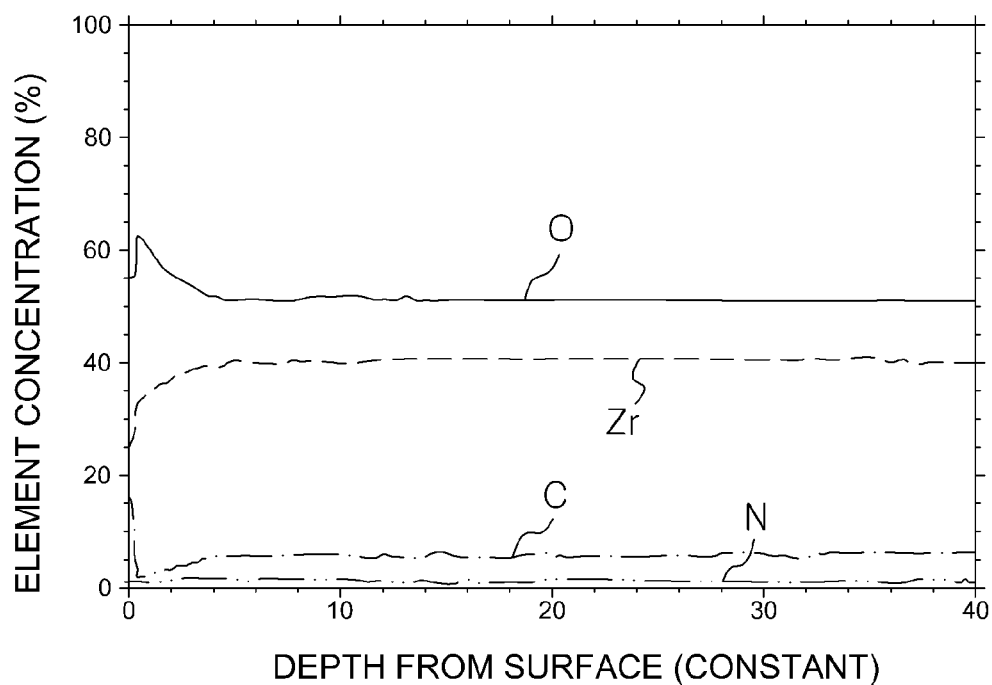
FIG. 1A is a view showing a composition of a film adhered to an inner wall of a nozzle according to an embodiment of the present invention, showing a composition of a film of the inner wall of the nozzle before gas cleaning.
Figure 1B:
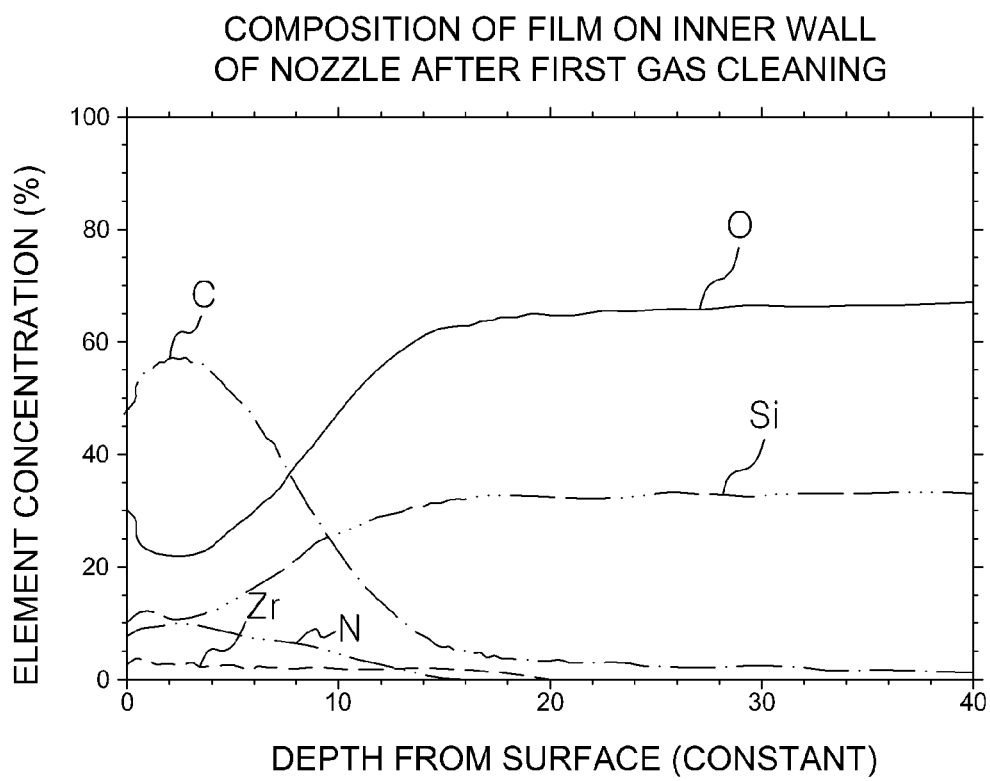
FIG. 1B is a view showing a composition of a film adhered to the inner wall of the nozzle according to an embodiment of the present invention, showing a composition of a film of the inner wall of the nozzle after first gas cleaning.

The inventors discovered that, even when the inside of a reaction tube is cleaned with a gas, a deposited film remains in an inner wall of a nozzle, and thus, it may be difficult to completely remove the deposited film. For this reason, the inventors first considered the reason that the deposited film remains in the inner wall of the nozzle after performing gas cleaning on the inside of the reaction tube. FIG. 1A shows a result in which a depth-direction film composition of a deposited film, adhered to the inner wall of the nozzle (which is an inner wall of a nozzle supplying TEMAZr when forming a $ZrO_2$ film) before gas cleaning, is analyzed by X-ray photoelectron spectroscopy (XPS). FIG. 1B shows a result in which a depth-direction film composition of a deposited film, adhered to the inner wall of the nozzle after first gas cleaning (first-time gas cleaning), is analyzed by the XPS (X-ray photoelectron spectroscopy). Comparing FIGS. 1A and 1B, it can be seen that although a Zr element is efficiently removed and thus the $ZrO_2$ film is removed by gas cleaning, the $ZrO_2$ film is segregated into a $ZrO_2$ film containing carbon (C) by 60%. This is considered to be because an organic source (organic compound) is used when forming a high-k film.

To overcome such limitations, the inventors invented a technique that efficiently reduces a C content by modifying a residual deposited film so as to remove C element from a deposited film remaining after the first gas cleaning, and removes the modified deposited film by second gas cleaning. The modification of the residual deposited film generates an oxidative species (reactive species) containing no water ($H_2O$) such as atomic oxygen (O) using O-containing gas so as to remove C element from a film, and exhausts CO or CO2 generated by a reaction with the oxidative species (reactive species). As an example of the O-containing gas, there may be $H_2+O_2$, $H_2O$, $O_2$, NO, $O_3$, etc. Hereinafter, further, the first gas cleaning, the modification, and the second gas cleaning may be referred to as cleaning in a broad sense.

In an embodiment of the present invention, an example of a substrate processing apparatus and a cleaning method thereof will be described later. The substrate processing apparatus according to an embodiment of the present invention is configured as an example of a semiconductor manufacturing apparatus used in manufacturing a semiconductor device [integrated circuits (IC)]. In the following description, a processing furnace will be described in a case in which a vertical apparatus performing film-forming processing on a substrate is used as an example of the substrate processing apparatus. However, the present invention does not necessarily need the use of the vertical apparatus, and for example, may use a single-wafer type substrate processing apparatus.

A processing furnace 202 applied to the substrate processing apparatus will be described with reference to FIGS. 3, 4, 5A and 5B.

Process Tube

The processing furnace 202 includes a vertical process tube 205, which is disposed in a vertical direction in order for a central line to be vertical and fixedly supported by a basket body (not shown), as a reaction tube. The process tube 205 includes an inner tube 204 and an outer tube 203. The inner tube 204 and the outer tube 203 are made of a high heat-resistant material, such as quartz ($SiO_2$) or silicon carbide (SiC), as one body in a cylindrical shape.

The inner tube 204 has a cylindrical shape with an upper end closed and a lower end open. A process chamber 201 is provided in the inner tube 204, and accommodates and processes wafers 200 which are stacked in a horizontal posture in a multi-stage manner by a boat 217 as a substrate support. A lower end opening of the inner tube 204 configures a furnace opening for loading or unloading the boat 217 retaining a group of the wafers 200. Therefore, an inner diameter of the inner tube 204 is set greater than the maximum outer diameter of the boat 217 retaining the group of wafers 200. The outer tube 203, which is similar to the inner tube 204, has a cylindrical shape with an upper end closed and a lower end open, and is covered in a concentric circle to surround an outer side of the inner tube 204. A lower end portion between the inner tube 204 and the outer tube 203 is hermetically encapsulated by a manifold 209 having a circular ring shape. The manifold 209 is installed to be attachable to or detachable from the inner tube 204 and the outer tube 203 so as to perform maintenance work or cleaning work on the inner tube 204 and the outer tube 203. The manifold 209 is supported by the basket body (not shown), and thus, the process tube 205 is installed vertically.

Exhaust Unit

An exhaust pipe 231 is an exhaust line that exhausts an atmosphere in the process chamber 201 and is connected to a portion of a side wall of the manifold 209. An exhaust port exhausting the atmosphere in the process chamber 201 is provided in a connection portion between the manifold 209 and the exhaust pipe 231. An exhaust port is disposed in the exhaust pipe 231 and communicates with an exhaust path formed as a gap between the inner tube 204 and the outer tube 203. Further, when seen in a horizontal cross-sectional view, the exhaust path has a circular ring shape of a predetermined width. A pressure sensor 245, an auto pressure controller (APC) value 231a that is a pressure adjusting valve, and a vacuum pump 231c that is a vacuum exhaust apparatus are installed in the exhaust pipe 231 in sequence from an upstream. The vacuum pump 231c is configured to vacuum-exhaust the inside of the process chamber 201 such that an inner pressure of the process chamber 201 reaches a predetermined pressure (vacuum level). A pressure control unit 636 is electrically connected to the APC valve 231a and the pressure sensor 245. The pressure control unit 636 controls a degree of valve opening of the APC valve 231a on the basis of pressure detected by the pressure sensor 245 such that the inner pressure of the process chamber 201 reaches a desired pressure at a desired timing. Mainly, an exhaust unit according to an embodiment of the present invention is configured by the exhaust pipe 231, the pressure sensor 245, and the APC valve 231a. Further, the vacuum pump 231c may include the exhaust unit.

Substrate Retainer

A seal cap 219 sealing a lower end opening of the manifold 209 is directly connected to the manifold 209 from a vertical-direction lower side. The seal cap 219 has a discal shape equal to or greater than the outer diameter of the outer tube 203, and raised and lowered in a vertical direction in a horizontal posture by a boat elevator 115 which is vertically disposed outside the process tube 205.

The boat 217, the substrate support retaining the wafer 200, is vertically stood and supported on the seal cap 219. The boat 217 includes a vertical pair of end plates 217c and a plurality of retaining members 217a that are vertically installed between the end plates 217c. The end plates 217c and the retaining members 217a are made of a heat-resistant material such as quartz ($SiO_2$) or silicon carbide (SiC). A plurality of retaining grooves 217b are installed at equal intervals in a lengthwise direction, in each of the retaining members 217a. The retaining members 217a are installed in order for the retaining grooves 217b to face each other. A circumference edge of the wafer 200 is inserted into the retaining groove 217b at the same stage among the plurality of retaining members 217a, and thus, the wafers 200 are stacked and held in a horizontal posture in a multi-stage manner with the center thereof being adjusted.

Moreover, a vertical pair of sub end plates 217d are supported by a plurality of sub retaining members 218 and installed between the boat 217 and the seal cap 219. A plurality of retaining grooves is installed in each of the sub retaining members 218. A plurality of disc-shaped adiabatic plates (not shown) made of, for example, a heat-resistant material such as quartz ($SiO_2$) or silicon carbide (SiC), are charged a horizontal posture in a multi-stage manner in the retaining grooves. Due to an adiabatic plate, heat from a heater unit 207 to be described later is difficult to be transferred to the manifold 209 side.

A rotary mechanism 254 rotating the boat 217 is installed at a side opposite to the process chamber 201 of the seal cap 219. A rotary shaft 255 of a rotary mechanism 254 passes through the seal cap 219 and supports the boat 217 from a lower portion. By rotating the rotary shaft 255, it is possible to rotate the wafer 200 in the process chamber 201. The seal cap 219 is raised and lowered in a vertical direction by the boat elevator 115, and thus, the boat 217 may be transferred to inside or outside the process chamber 201.

A driving control unit 637 is electrically connected to the rotary mechanism 254 and the boat elevator 115. The driving control unit 637 performs control in order for each of the rotary mechanism 254 and boat elevator 115 to perform a desired operation at a desired timing.

Heater Unit

A heater unit 207, which overall heats the inside of the process tube 205 at a uniform or predetermined temperature distribution, is installed as a heating mechanism outside the outer tube 203 to surround the outer tube 203. The heater unit 207 is vertically installed by being supported by the basket body (not shown) of the substrate processing apparatus 101, and for example, configured as a resistance heating heater such as a carbon heater.

A temperature sensor 263 is installed as a temperature detector in the process tube 205. A temperature control unit 638 is electrically connected to the heater unit 207 and the temperature sensor 263. The temperature control unit 638 controls an electrical connection state to the heater unit 207 on the basis of temperature information detected by the temperature sensor 263 such that a temperature in the process chamber 201 reaches a desired temperature distribution at a desired timing.

The heater unit 207 is mainly configured by the heater unit 207 and the temperature sensor 263.

Processing Gas Supply Unit

Figure 3:
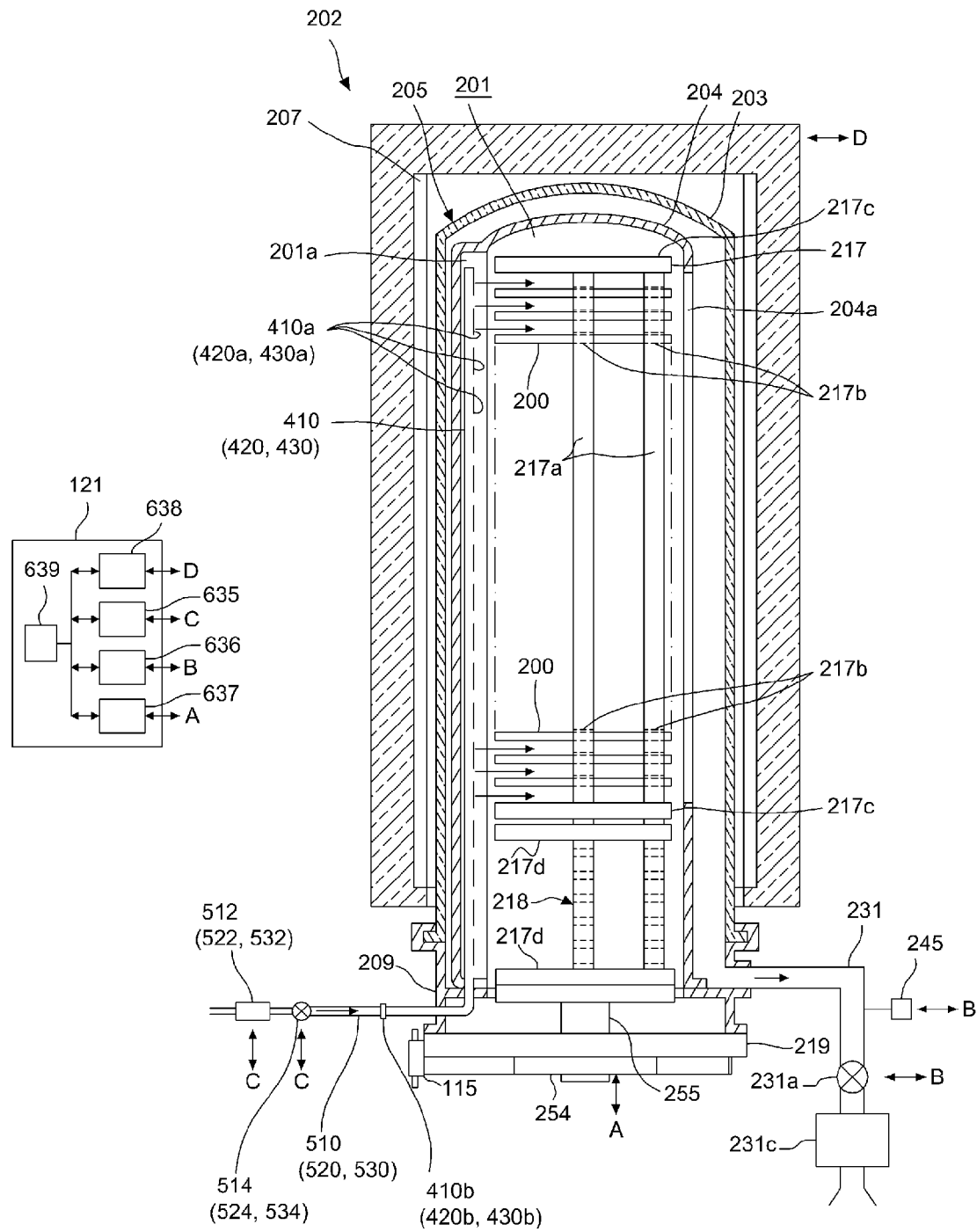
FIG. 3 is a schematic view of an example of a processing furnace exemplarily used in an embodiment of the present invention and a member incidental thereto, particularly showing a longitudinal cross-sectional view of the processing furnace.
Figure 4:
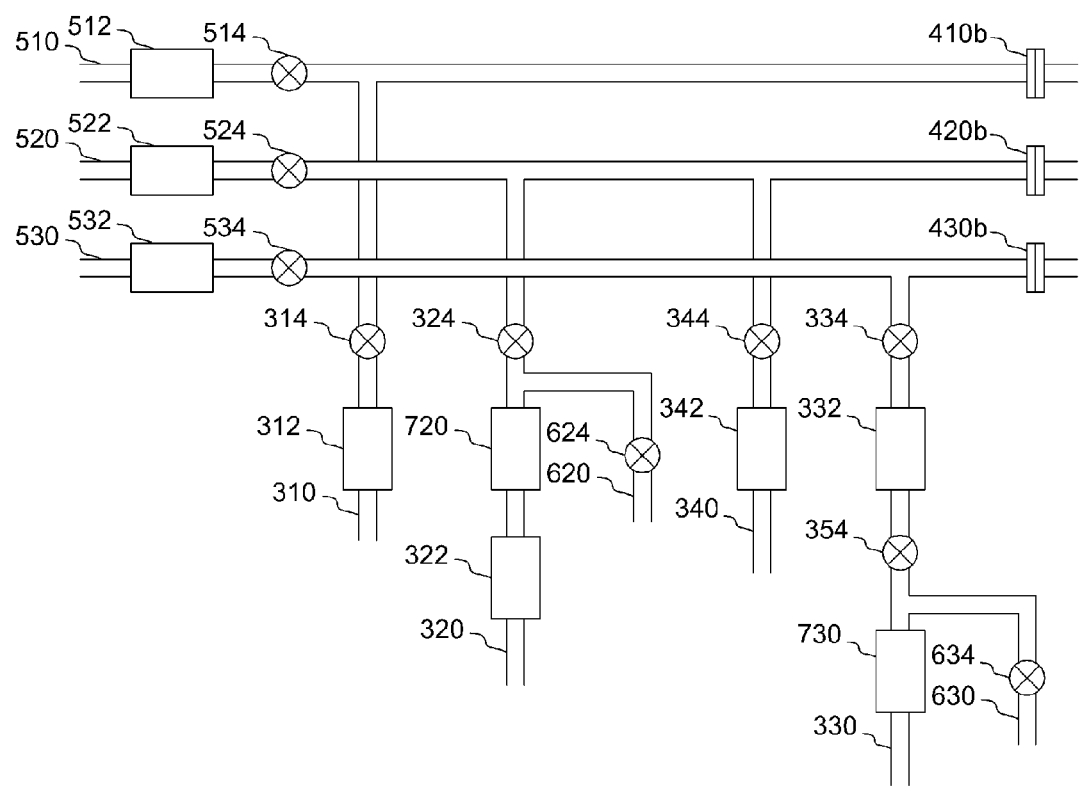
FIG. 4 is a view showing a shape of a pipeline connected to the processing furnace of FIG. 3 exemplarily used in an embodiment of the present invention.
Figure 5A:
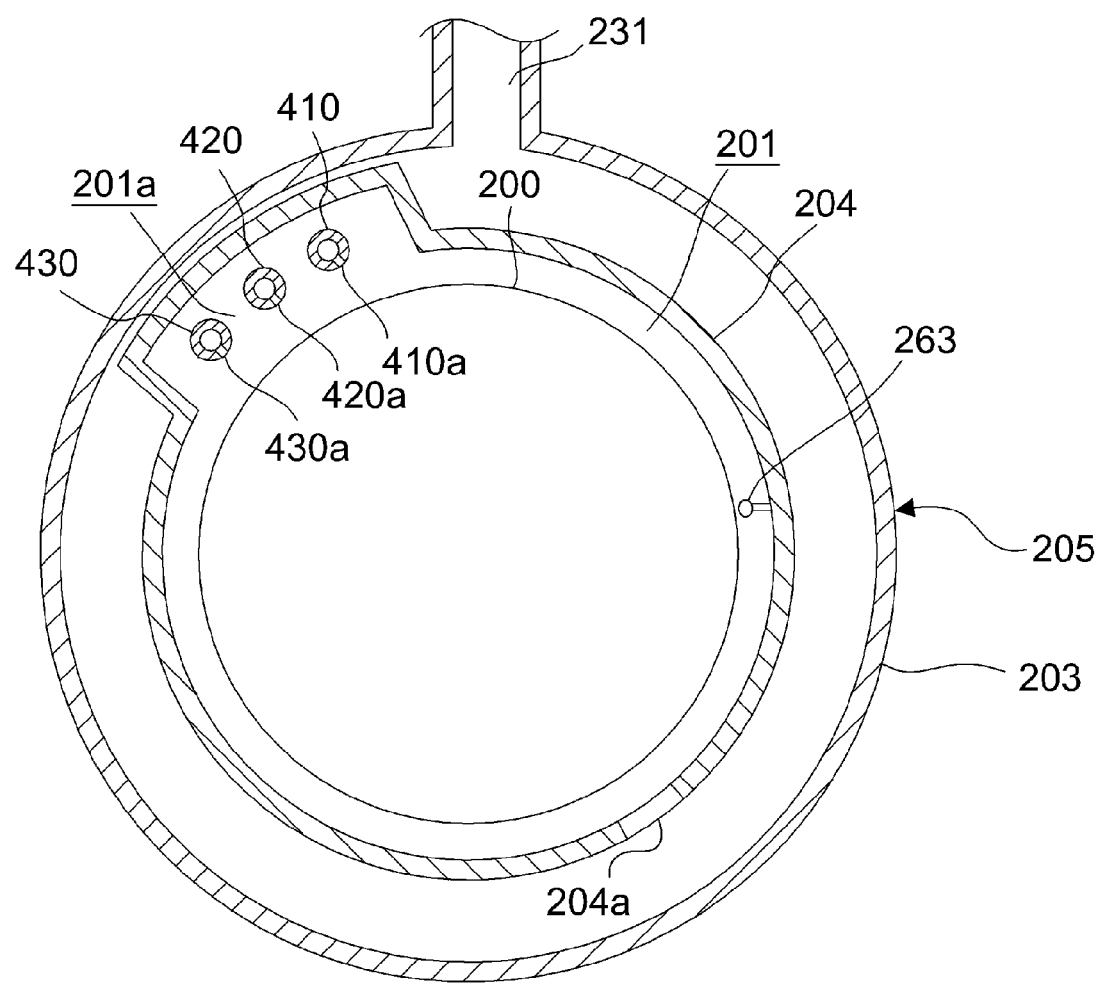
FIG. 5A is a cross-sectional view of the processing furnace of FIG. 3 exemplarily used in an embodiment of the present invention.

Moreover, FIG. 5A is a cross-sectional view of the processing furnace of FIG. 3 exemplarily used in an embodiment of the present invention. The processing gas supply unit in an embodiment of the present invention will be described with reference to FIG. 5A. A channel-shaped auxiliary chamber 201a protrudes from a side wall of the inner tube 204 toward the outside of the inner tube 204 (opposite to a later-described exhaust hole 204a by 180 degrees) and extends in a vertical direction. A side wall 26 of the auxiliary chamber 201a configures a portion of the side wall of the inner tube 204. Further, an inner wall of the auxiliary chamber 201a configures a portion of an inner wall of the process chamber 201. Nozzles 410, 420, and 430 supplying a processing gas into the process chamber 201 extend in a stack direction of the wafers 200 along the inner wall [i.e., the inner wall of the process chamber 201] of the auxiliary chamber 201a, and installed in the inside of the auxiliary chamber 201a. Each of the nozzles 410, 420 and 430 has an L-shape including a horizontal part and a vertical part. A plurality of gas supply holes 410a, 420a, and 430a supplying the processing gas (source gas) is respectively installed at side surfaces of the nozzles 410, 420, and 430. The gas supply holes 410a, 420a, and 430a have the same opening area from a lower portion to an upper portion thereof or an opening area inclined in size, and are installed at the same opening pitch.

The processing gas introduction ports 410b, 420b, and 430b, which are respective upstream side end portions of the nozzles 410, 420, and 430, pass through the side wall of the manifold 209 to outside the diameter direction of the manifold 209 and protrude to outside the process tube 205. Processing gas supply pipes 310, 320, and 330, respective processing gas supply lines, are respectively connected to the processing gas introduction ports 410b, 420b, and 430b.

Figure 5B:
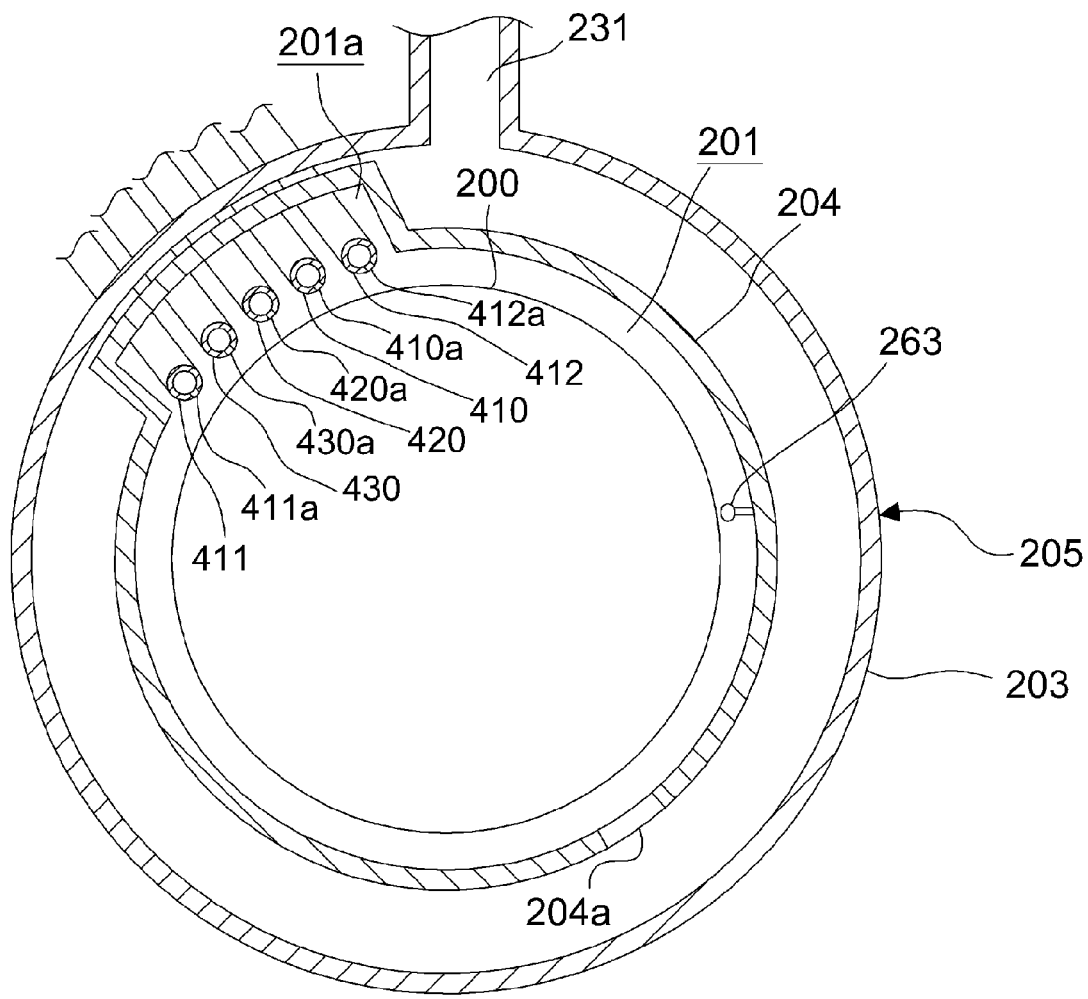
FIG. 5B is a cross-sectional view of a processing furnace used in another embodiment of the present invention.

FIG. 5B is a cross-sectional view of a processing furnace used in another embodiment of the present invention. Further, nozzles 411 and 412 supplying $N_2$ gas (which is an inert gas) or the like as a carrier gas are installed at both sides of the above-described processing gas supply unit of FIG. 5A. Each of the nozzles 411 and 412 are configured in an L-shape including a vertical part and a horizontal part similarly to the nozzle 410. A plurality of gas supply holes 411a and 412a supplying an inert gas is respectively installed at side surfaces of the nozzles 411 and 412. Areas of the gas supply holes 411a and 412a do not vary with height, or become greater or smaller as they go from a lower portion to an upper portion. The gas supply holes 411a and 412a are installed with same opening pitches. Further, the nozzles 411 and 412 are configured in order for the nozzle 410 to be disposed at both sides. Further, a flow rate of an inert gas supplied through the nozzles 411 and 412 is optimized by a processing condition. Therefore, a processing gas supplied from the nozzle 410 [gas supply hole 410a] to the process chamber 201 efficiently flows on a surface of the wafer 200, and also, by supplying the inert gas through the nozzles 411 and 412, the processing gas supplied from the nozzle 410 or the like is difficult to reach the inner wall of the process chamber 201. Accordingly, a film thickness deposited at, for example, the inner wall of the process chamber 201, in addition to the wafer 200, can be suppressed, and thus, a period of maintenance such as cleaning in the present invention can be extended. Next, in an embodiment of the present invention, the three nozzles of FIG. 5A will be described.

For example, a processing gas supply source (not shown) supplying $H_2$ (which is H-containing gas) or the like, a mass flow controller (MFC) 312 that is a flow rate control device (flow rate control unit), and a valve 314 are installed in the processing gas supply pipe 310 in sequence from an upstream side. A first processing gas supply system (first processing gas supply means) is mainly configured by the nozzle 410, the processing gas supply pipe 310, the MFC 312, and the valve 314.

Moreover, a downstream end of a carrier gas supply pipe 510 supplying $N_2$ gas (which is an inert gas) or the like as a carrier gas is connected to a downstream end of the valve 314 of the processing gas supply pipe 310. A mass flow controller (MFC) 512, which is a flow rate control device (flow rate control means), and a valve 514 are installed in the carrier gas supply pipe 510 in order from an upstream side. A first carrier gas supply system (first carrier gas supply means) is mainly configured by the carrier gas supply pipe 510, the MFC 512, and the valve 514.

For example, a processing gas supply source (not shown) supplying tetrakis(ethylmethylamino)zirconium (TEMAZr, Zr[NCH$_3$C$_2$H$_5$]$_4$), tetrakis(ethylmethylamino)hafnium (TEMAHf, Hf[NCH$_3$C$_2$H$_5$]$_4$), or the like as a liquid source, a mass flow controller (MFC) 322 that is a flow rate control device (flow rate control unit), a vaporizer 720 that is a vaporization unit (vaporization means), and a valve 324 are installed in the processing gas supply pipe 320. Further, an upstream end of a vent line 620 connected to the exhaust pipe 231 is connected between the vaporizer 720 and the valve 324 in the processing gas supply pipe 320. A valve 624 is installed in the vent line 620. When the processing gas is not supplied into the process chamber 201, the valve 624 is opened with the valve 324 being closed, and the processing gas is exhausted to the vent line 620 via the valve 624. A second processing gas supply system (second processing gas supply means) is mainly configured by the nozzle 420, the processing gas supply pipe 320, the MFC 322, the vaporizer 720, the valve 324, the vent line 620, and the valve 624.

Moreover, a downstream end of a carrier gas supply pipe 520 supplying $N_2$ gas (which is an inert gas) or the like as a carrier gas is connected to a downstream end of the valve 324 of the processing gas supply pipe 320. A mass flow controller (MFC) 522, which is a flow rate control device (flow rate control means), and a valve 524 are installed in the carrier gas supply pipe 520 in order from an upstream side. A second carrier gas supply system (second carrier gas supply means) is mainly configured by the carrier gas supply pipe 520, the MFC 522, and the valve 524.

Moreover, a downstream end of a cleaning gas supply pipe 340 is connected to the processing gas supply pipe 320 at a portion closer to the process chamber 201 than a connection portion with the carrier gas supply pipe 520. For example, a cleaning gas supply source (not shown) supplying BCl$_3$, HCl, Cl$_2$, SiCl$_4$, HBr, BBr$_3$, SiBr$_4$, and Br$_2$ as a cleaning gas (etching gas), a mass flow controller (MFC) 342 that is a flow rate control device (flow rate control unit), and a valve 344 are installed in the cleaning gas supply pipe 340 in order from an upstream side. The cleaning gas is supplied into the process chamber 201 via the nozzle 420. A cleaning gas supply system (cleaning gas supply means) is mainly configured by the cleaning gas supply pipe 340, the MFC 342, and the valve 344. The cleaning gas is supplied into the process chamber 201 via the nozzle 420 through the processing gas supply pipe 320.

For example, a supply source (not shown) supplying $O_2$ as an oxidation gas (oxidative species), an ozonizer 730 (ozone generation device, ozone generator) generating ozone ($O_3$), a valve 354, a mass flow controller (MFC) 332 that is a flow rate control device (flow rate control unit), and a valve 334 are installed in the processing gas supply pipe 330 in order from an upstream side. Further, an upstream end of a vent line 630 connected to the exhaust pipe 231 is connected between the ozonizer 730 and the MFC 332 in processing gas supply pipe 330. A valve 634 is installed in the vent line 630. When the oxidation gas is not supplied into the process chamber 201, the valve 634 is opened with the valve 334 being closed, and the processing gas is exhausted to the vent line 630 via the valve 634. A third processing gas supply system (third processing gas supply means) is mainly configured by the nozzle 430, the processing gas supply pipe 330, the ozonizer 730, the valve 354, the MFC 332, the valve 334, the vent line 630, and the valve 634.

Moreover, a downstream end of a carrier gas supply pipe 530 supplying $N_2$ gas (which is an inert gas) or the like as a carrier gas is connected to a downstream end of the valve 334 of the processing gas supply pipe 330. A mass flow controller (MFC) 532, which is a flow rate control device (flow rate control means), and a valve 534 are installed in the carrier gas supply pipe 530 in order from an upstream side. A third carrier gas supply system (third carrier gas supply means) is mainly configured by the carrier gas supply pipe 530, the MFC 532, and the valve 534.

Moreover, when $O_3$ is used as a processing gas, $O_3$ is generated by supplying $O_2$ to the ozonizer 730 and supplied into the process chamber 201. However, by supplying $O_2$ into the process chamber without generating $O_3$, it is possible to use $O_2$ as the processing gas. Further, in supplying $O_2$ into the process chamber 201, the controllable maximum flow rate may be connected to different MFCs, and $O_2$ may be supplied into the process chamber 201 by controlling a flow rate thereof.

A gas supply and flow rate control unit 635 is electrically connected to the MFCs 312, 322, 332, 342, 512, 522, and 532 and the valves 314, 324, 334, 344, 354, 514, 524, 534, 624, and 634. The gas supply and flow rate control unit 635 controls the MFCs 312, 322, 332, 342, 512, 522, and 532 and the valves 314, 324, 334, 344, 354, 514, 524, 534, 624, and 634 such that, in later-described steps, the kind of a gas supplied into the process chamber 201 becomes a desired gas species at a desired timing, a flow rate of supplied gas reaches a desired flow rate at a desired timing, and a concentration of a processing gas to an inert gas reaches a desired concentration at a desired timing.

An exhaust hole 204a, which is through-hole having a slit shape is disposed on the side wall of the inner tube 204 opposite to the nozzles 410, 420, and 430, i. e. at a position opposite to the auxiliary chamber 201a by 180 degrees. The inside of the process chamber 201 communicates with the inside of the exhaust path via the exhaust hole 204a. Therefore, the processing gas supplied into the process chamber through discharge ports 410a, 420a, and 430a of the nozzles 410, 420, and 430 flows into the exhaust path via the exhaust hole 204a, flows into the exhaust pipe 231 via the exhaust port, and is discharged to outside the processing furnace 202. Further, the exhaust hole 204a is not limited to the slit-shaped through-hole and may be a plurality of through-holes.

Moreover, as shown in FIGS. 5A and 5B, a straight line connecting the nozzle 410 and the exhaust hole 204a, a straight line connecting the nozzle 420 and the exhaust hole 204a, and a straight line connecting the nozzle 430 and the exhaust hole 204a may pass near the center of each of the wafers 200. Further, a direction of a discharge port (not shown) may be set in almost parallel to the first straight lines.

Controller

The members, such as the MFCs 312, 322, 332, 342, 512, 522, and 532, the valves 314, 324, 334, 344, 354, 514, 524, 534, 624, and 634, the APC valve 231a, the heater 207, the temperature sensor 263, the pressure sensor 245, the vacuum pump 231c, a boat rotating mechanism 254, and the boat elevator 115, are connected to a controller 121. The controller 121 is an example of a control unit (control means) that controls an overall operation of the substrate processing apparatus 101, and controls flow rate adjustments of the mass flow controllers 312, 322, 332, 342, 512, 522, and 532, opening/closing operations of the valves 314, 324, 334, 344, 354, 514, 524, 534, 624, and 634, an opening/closing operation and pressure adjusting operation of the APC valve 231a, a temperature adjusting operation of the heater 207 based on the temperature sensor 263, start and stop of the vacuum pump 231c based on the pressure sensor 245, rotation speed adjustment of the boat rotating mechanism 254, an elevation operation of the boat elevator 115, and so on.

Figure 10:
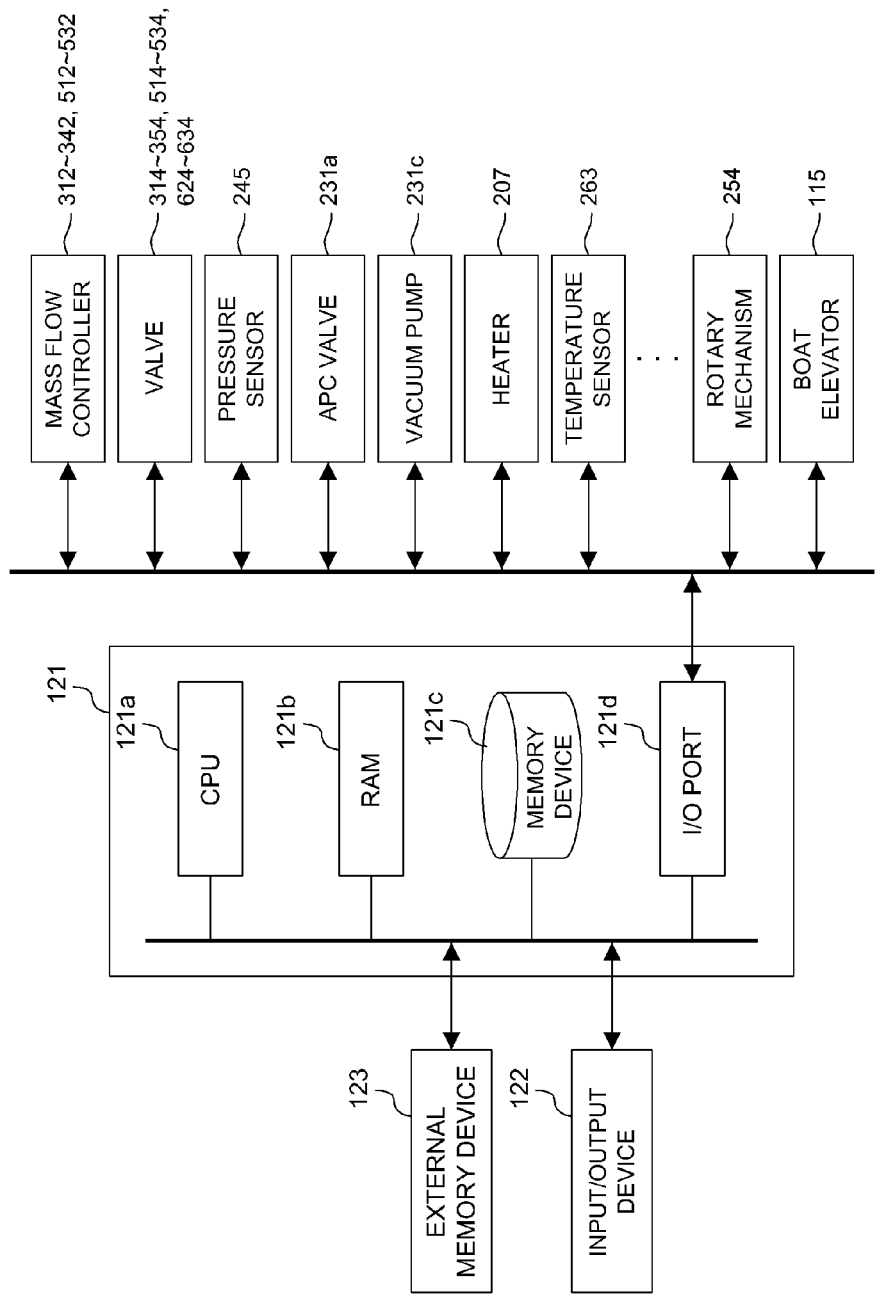
FIG. 10 is a view showing a controller according to an embodiment of the present invention.

FIG. 10 shows the controller 121. As shown in FIG. 10, the controller 121 is configured as a computer including a central processing unit (CPU) 121a, a random access memory (RAM) 121b, a memory device 121c, and an I/O port 121d. The RAM 121b, the memory device 121c, and the I/O port 121d are configured to exchange data with the CPU 121a via an internal bus 121e. An input/output device 122 including, for example, a touch panel, is connected to the controller 121.

The memory device 121c is constituted by, for example, a flash memory, a hard disk drive (HDD), or the like. A control program for controlling an operation of the substrate processing apparatus or a process recipe, in which a step or condition for processing a substrate (to be described later) is written, is readably stored in the memory device 121c. In addition, the process recipe, which functions as a program, is combined to execute each sequence in the substrate processing process (to be described later) in the controller 121 to obtain a predetermined result. Hereinafter, the process recipe or control program may be generally simply referred to as a program. In addition, when term "program" is used herein, it may include the case in which the process recipe is solely included, the case in which the control program is solely included, or the case in which both of these are included. In addition, the RAM 121b is configured as a memory region (a work area) in which a program or data read by the CPU 121a is temporarily stored.

The I/O port 121d is connected to the mass flow controllers 312, 322, 332, 342, 512, 522, and 532, the valves 314, 324, 334, 344, 354, 514, 524, 534, 624, and 634, the pressure sensor 245, the APC valve 231a, the vacuum pump 231c, the heater 207, the temperature sensor 263, the rotary mechanism 254, and the boat elevator 115, and so on.

The CPU 121a is configured to read and execute the control program from the memory device 121c and read the process recipe from the memory device 121c according to input of an operation command from the input/output device 122. In addition, the CPU 121a is configured to control flow rate controlling operations of various gases by the mass flow controllers 312, 322, 332, 342, 512, 522, and 532 according to contents of the read process recipe, opening/closing operations of the valves 314, 324, 334, 344, 354, 514, 524, 534, 624, and 634, an opening/closing operation of the APC valve 231a and a pressure adjusting operation by the APC valve 231a based on the pressure sensor 245, a temperature adjusting operation of the heater 207 based on the temperature sensor 263, start and stop of the vacuum pump 231c, a rotation and rotation speed adjustment operation of the boat 217 by the rotary mechanism 254, an elevation operation of the boat 217 by the boat elevator 115, and so on.

In addition, the controller 121 is not limited to being configured as an exclusive computer but may be configured as a general-purpose computer. For example, the controller 121 according to the embodiment can be configured by preparing an external memory device 123, in which the program is stored [for example, a magnetic tape, a magnetic disk such as a flexible disk or a hard disk, an optical disc such as a CD or DVD, an optomagnetic disc such as an MO, a semiconductor memory such as a USB memory or a memory card], and installing the program on the general-purpose computer using the external memory device 123. In addition, a unit configured to supply a program to a computer is not limited to the case in which the program is supplied via the external memory device 123. For example, the program may be supplied using a communication means such as the Internet or a dedicated line, rather than via the external memory device 123. Further, the memory device 121c or the external memory device 123 is configured as a non-transitory computer readable recording medium, which is readable by a computer. Hereinafter, these are generally simply referred to as recording media. Furthermore, when the term "non-transitory computer readable recording medium" is used herein, it may include the case in which the memory device 121c is solely included, the case in which the external memory device 123 is solely included, or the case in which both of these are included.

Next, one process of a process of manufacturing a semiconductor device using the processing furnace 202 will be described. A method of forming a film on the wafer 200 in the process chamber 201, a method of cleaning the inside of the inner tube 204 and the insides of the nozzles 410, 420, and 430, and a method of modifying films adhered to the inside of the inner tube 204 and the insides of the nozzles 410, 420, and 430 will be described. In the following description, operations of the respective parts configuring the substrate processing apparatus are controlled by the controller 121.

A film-forming method includes a technique that alternately supplies at least two kinds of processing gases, which react with each other and are used in film-forming under a specific film-forming condition (temperature, time, etc.), one kind by one kind onto a substrate, and for example, performs film-forming using a reaction such as a surface reaction. In this case, control of a film thickness is performed according to the number of cycles that supplies a reactive gas (for example, when a depositing rate is 1 nÅ/cycle, a film of 20 nÅ is formed by performing supply of the reactive gas by 20 cycles). An example, which forms a $ZrO_2$ (which is a high-k film) on the wafer 200 using TEMAZr and $O_3$ as processing gases, will be described.

An example, which cleans the inside of the process chamber 201 and the insides of the nozzles 410, 420, and 430 by a thermochemical reaction using $BCl_3$ as a cleaning gas, will be described as a cleaning method.

An example, which modifies films adhered to the inside of the process chamber 201 and the insides of the nozzles 410, 420, and 430 using $H_2$ and $O_2$ as modifying gases, will be described as a modifying method.

Hereinafter, an example in which a $ZrO_2$ film is formed on the wafer 200 by a substrate processing process, a thickness of a deposited film in the inner tube reaches a predetermined film thickness, and films adhered to the inside of the process chamber 201 and the insides of the nozzles 410, 420, and 430 are removed by sequentially performing a first cleaning process, a modification process, and a second cleaning process, will be described with reference to FIGS. 6 through 9 and 12. Further, FIG. 12 does not show the film-forming process of FIG. 6 and clearly shows details of cleaning recipe including the first cleaning process and the second cleaning process.

(1) Substrate Processing Process

Substrate Loading Process

First, the plurality of wafers 200 are charged on the boat 217 (wafer charging). Furthermore, the boat 217 retaining the plurality of wafers 200 is raised by the boat elevator 115 and loaded into the inner tube 204 (boat loading). In this state, the seal cap 219 hermetically seals the lower end of the manifold 209 via an O-ring 220b. Further, in the substrate loading process, a purge gas may be continuously supplied into the inner tube 204 by opening the valves 514, 524, and 534.

Pressure Decreasing and Temperature Increasing Process

Subsequently, the valves 514, 524, and 534 are closed, and the inside of the inner tube 204 [the inside of the process chamber 201] is exhausted by the vacuum pump 231c so as to have a desired processing pressure (vacuum level) (pressure adjustment). At this point, a degree of valve opening of the APC valve 231a is feedback controlled based on a pressure measured by the pressure sensor 245. Further, an electrical flow rate to the heater 207 is adjusted (temperature adjustment) such that surfaces of the wafers 200 have a desired processing temperature. At this point, an electrical connection state to the heater 207 is feedback controlled based on temperature information detected by the temperature sensor 263. Furthermore, the rotary mechanism 254 rotates the boat 217 and the wafers 200. By rotating the wafers 200, it is possible to uniformize flow rates of a gas supplied to the surfaces of the wafers 200.

Moreover, as conditions in ending the pressure decreasing and temperature increasing process, for example, Processing pressure: 10 to 1,000 Pa, preferably 50 Pa, and
Processing temperature: 180 to 250 degrees C., preferably 220 degrees C. are exemplarily set.

Film-Forming Process

Subsequently, steps 11 through 14 may be set as one cycle, and, by repeating the cycle a predetermined number of times, a high-k film ($ZrO_2$ film) of a desired thickness is formed on the wafer 200. FIG. 7 shows gas supply sequences in respective processes of the steps 11 through 14.

TEMAZr Supplying Process (Step 11)

First, TEMAZr is pressurization-supplied as a liquid source into the vaporizer 720, and vaporized TEMAZr (vaporization gas) is generated by vaporizing TEMAZr in the vaporizer 260. Until TEMAZr is stably generated, by closing the valve 324 and opening the valve 624, TEMAZr is previously discharged through the vent line 620.

When TEMAZr is stably generated, by closing the valve 624 and opening the opening/closing valve 324, TEMAZr is supplied into the inner tube 204 via the nozzle 420. At this point, by opening the valve 524, TEMAZr from the vaporizer 720 is diluted by $N_2$ (carrier gas) from the carrier gas supply pipe 520 and supplied into the inner tube 204. In this case, a flow rate of TEMAZr may be, for example, 0.35 g/min, and a flow rate of $N_2$ from the carrier gas supply pipe 520 may be, for example, 8 slm.

TEMAZr supplied into the inner tube 204 through the nozzle 420 becomes a horizontal-direction gas stream traveling toward the gas exhaust port 204a through the gas supply hole 420a, and is exhausted through the exhaust pipe 231. At this point, TEMAZr gas is supplied to the respective surfaces of the stacked wafers 200, thereby forming a Zr-containing layer on each of the wafers 200. The TEMAZr gas supplied into the process chamber 201 is supplied to the wafers 200 and moreover supplied to surfaces of the respective members in the process chamber 201, namely, the inner wall of the inner tube 204, the inner wall of the manifold 209, the boat 217 installed in the process chamber 201, and outer walls and inner walls of the nozzles 410, 420, and 430. As a result, the Zr-containing layer is also formed on the surfaces of the respective members in the process chamber 201, in addition to the wafers 200.

After a predetermined time (for example, 120 sec) elapses, TEMAZr is continuously generated by closing the valve 324 and opening the valve 624, and then, the supply of TEMAZr into the inner tube 204 is suspended.

Residual Gas Removing Process (Step 12)

Subsequently, the valves 514, 524, and 534 are opened, and $N_2$ (purge gas) is supplied into the inner tube 204. At this time, a flow rate of $N_2$ from the carrier gas supply pipe 520 may be, for example, 5 slm, a flow rate of $N_2$ from the carrier gas supply pipe 530 may be, for example, 4 slm, and a flow rate of $N_2$ from the carrier gas supply pipe 510 may be, for example, 4 slm. Therefore, discharge of TEMAZr from inside the inner tube 204 is facilitated. After a predetermined time (for example, 20 sec) elapses, when an atmosphere in the inner tube 204 is converted into $N_2$ gas, the valves 514, 524, and 534 are closed, and the supply of the $N_2$ gas into the inner tube 204 is suspended. The inside of the inner tube 204 is exhausted for a predetermined time (for example, 20 sec).

$O_3$ Supplying Process (Step 13)

Subsequently, $O_3$ (oxidative species) is generated as an oxidation gas by supplying $O_2$ (oxygen) to the ozonizer 730. Until $O_3$ is stably generated, by closing the valve 354 and opening the valve 634, $O_3$ is previously exhausted through the vent line 630.

When $O_3$ is stably generated, by closing the valve 634 and opening the valves 334 and 354, $O_3$ is supplied into the inner tube 204 via the nozzle 430. At this point, by opening the valve 534, $O_3$ is diluted by $N_2$ (carrier gas) from the carrier gas supply pipe 530 and supplied into the inner tube 204 through the nozzle 430. At this time, a flow rate of $O_3$ may be, for example, 6 slm, and a flow rate of $N_2$ from the carrier gas supply pipe 530 may be, for example, 2 slm. $O_3$ supplied into the inner tube 204 through the nozzle 430 becomes a horizontal-direction gas stream traveling from the gas supply hole 430a toward the gas exhaust port 204a, and is exhausted through the exhaust pipe 231. At this point, $O_3$ is supplied to the respective surfaces of the stacked wafers 200, and, a Zr-containing layer and $O_3$ on each of the wafers 200 react with each other, thereby generating a high-k layer ($ZrO_2$ layer) on each wafer 200.

When the supply of $O_3$ is continued for a predetermined time, the generation of $O_3$ is continued by closing the valves 334 and 354 and opening the valve 634, and then, the supply of $O_3$ into the inner tube 204 is suspended.

Residual Gas Removing Process (Step 14)

Subsequently, the valves 514, 524 and 534 are opened, and $N_2$ (purge gas) is supplied into the inner tube 204. At this time, a flow rate of $N_2$ from each of the carrier gas supply pipes 510, 520, and 530 may be, for example, 4 slm. Therefore, discharge of $O_3$ and a reaction byproduct from inside the inner tube 204 is facilitated. After a predetermined time (for example, 10 sec) elapses, when the atmosphere in the inner tube 204 is converted into $N_2$, the valves 514, 524 and 534 are closed, and the supply of the $N_2$ gas into the inner tube 204 is suspended. The inside of the inner tube 204 is exhausted for a predetermined time (for example, 15 sec).

Subsequently, the steps 11 through 14 may be set as one cycle, and, by repeating the cycle a predetermined number of times, TEMAZr and $O_3$ are alternately supplied into the inner tube 204 without mixing therebetween, thereby forming a high-k film ($ZrO_2$ film) of a desired thickness on the wafer 200. Further, the respective processes are not limited to the above-described processing conditions.

Processing Conditions of TEMAZr Supplying Process (Step 11):
Processing pressure: 10 to 700 Pa, preferably 250 Pa,
Flow rate of TEMAZr: 0.01 to 0.35 g/min, preferably 0.3 g/min,
Flow rate of $N_2$: 0.1 to 1.5 slm, preferably 1.0 slm,
Processing temperature: 180 to 250 degrees C., preferably 220 degrees C.,
Performing time: 30 to 180 sec, preferably 120 sec
Processing Conditions of Residual Gas Removing Process (Step 12):
Processing pressure: 10 to 100 Pa, preferably 70 Pa,
Flow rate of $N_2$: 0.5 to 20 slm, preferably 12 slm,
Processing temperature: 180 to 250 degrees C., preferably 220 degrees C.,
Performing time: 30 to 150 sec, preferably 60 sec
Processing Conditions of $O_3$ Supplying Process (Step 13):
Processing pressure: 10 to 300 Pa, preferably 100 Pa,
Flow rate of $O_3$: 6 to 20 slm, preferably 17 slm,
Flow rate of $N_2$: 0 to 2 slm, preferably 0.5 slm,
Processing temperature: 180 to 250 degrees C., preferably 220 degrees C.,
Performing time: 10 to 300 sec, preferably 120 sec
Processing Conditions of Residual Gas Removing Process (Step 14):
Processing pressure: 10 to 100 Pa, preferably 70 Pa,
Flow rate of $N_2$: 0.5 to 20 slm, preferably 12 slm,
Processing temperature: 180 to 250 degrees C., preferably 220 degrees C.,
Performing time: 10 to 90 sec, preferably 60 sec
Pressurization Process, Substrate Loading Process A high-k layer ($ZrO_2$ layer) of a desired thickness is formed on the wafer 200, and then, the valves 514, 524, and 534 are opened by smaller setting a degree of valve opening of the APC valve 231a, and a purge gas is supplied into the process tube 205 [inner tube 204] until a pressure in the process tube 205 [in the inner tube 204 and in the outer tube 203] reaches the atmospheric pressure (purge process, atmospheric pressure return process). The film-formed wafer 200 is unloaded from inside the inner tube 204 in a reverse procedure to the substrate loading process. Then, the processed wafer 200 is discharged from the boat 217 (wafer discharging). Further, in the substrate unloading process, the purge gas may be continuously supplied into the inner tube 204 by opening the opening/closing valves 514, 524, and 534.

It can be seen in FIG. 1A that a Zr element and a C element remain as deposited films of the inner wall of the nozzle 420 which has supplied TEMAZr into the process chamber 201, and thus, a segregated zirconium oxide film including a zirconium dioxide film ($ZrO_2$ film) or carbon (C) remains.

(2) First Cleaning Process

A thickness of a deposited film adhered to the inside of the inner tube 204 reaches a predetermined film thickness by performing a film-forming process, and then, a cleaning process is performed. An example which cleans the deposited film with $BCl_3$ will be described with reference to FIGS. 6 and 8.

Boat Loading Process

First, the boat with no wafer 200 mounted thereon is raised by the boat elevator 115 and loaded into the inner tube 204 (boat loading). In this state, the seal cap 219 hermetically seals the lower end of the manifold 209 via the O-ring 220b. Further, in the substrate loading process, a purge gas may be continuously supplied into the inner tube 204 by opening the valves 514, 524 and 534.

Vacuum Exhaust Process (Step 21)

Subsequently, the valves 514, 524, and 534 are closed, and the inside of the inner tube 204 [the inside of the process chamber 201] is exhausted by the vacuum pump 231c (pressure adjustment) so as to have a desired pressure (vacuum level). At this point, a degree of valve opening of the APC valve 231a is feedback controlled based on a pressure measured by the pressure sensor 245. An inner pressure of the process chamber 201 reaches a predetermined pressure, and then the APC valve 231a is closed. Further, an electrical flow rate to the heater 207 is adjusted (temperature adjustment) such that a temperature in the process chamber 201 reaches a desired processing temperature. At this point, an electrical connection state to the heater 207 is feedback controlled based on temperature information detected by the temperature sensor 263. Subsequently, the rotary mechanism 254 rotates the boat 217 and the wafers 200. However, the boat 217 doesn't have to be rotated.

$BCl_3$ and $O_2$ Supplying Process (Step 22)

When the APC valve 231a is closed and an inner pressure of the process chamber 201 reaches a first pressure, by opening the valves 344, 334, and 354, $BCl_3$ and $O_2$ are supplied from the respective gas supply pipes 340 and 330 into the process chamber 201 via the respective nozzles 420 and 430 for a predetermined time. At this point, $O_2$ is supplied in an $O_2$ state without the ozonizer generating $O_3$. When the controllable maximum flow rate is connected to the plurality of different MFCs, a preferable MFC is selected, and $O_2$ may be supplied into the process chamber 201 by controlling a flow rate thereof. Further, an etching gas may be diluted by opening the valves 524 and 534 and supplying $N_2$ into the process chamber 201. At this time, a flow rate of $BCl_3$ supplied into the process chamber 201 through the gas supply pipe 340 may be, for example, 1 slm. Further, a flow rate of $O_3$ supplied into the process chamber 201 through the gas supply pipe 330 may be, for example, 0.02 slm. Further, a concentration of $O_3$ added into $BCl_3$ is 0 to 4%, for example, may be 2%. The reason is because, as an $O_2$ concentration increases, an etching rate increases to have the maximum value of 2%. However, when the $O_2$ concentration is higher than 4%, the etching rate decreases, and thus, the maximum value may be 4%.

At a time when an inner pressure of the process chamber 201 reaches a second pressure, for example, 13,300 Pa (100 Ton), the supply of $BCl_3$ and $O_2$ into the process chamber 201 is suspended by closing the valves 344, 334, and 354. For example, a time taken in supplying $BCl_3$ and $O_2$ may be 270 sec. At this time, when $N_2$ is supplied, the valves 524 and 534 are closed, and the supply of $N_2$ into the process chamber 201 is suspended. Therefore, a supply system is encapsulated. At this point, all of the valves are closed. That is, both a gas supply system and an exhaust system are encapsulated. Thus, the inside of the process chamber 201 is encapsulated, and $BCl_3$ and $O_2$ are enclosed in the process chamber 201.

Etching Process (Step 23)

By encapsulating the gas supply system and the exhaust system, the inside of the process chamber 201 is encapsulated, and a state in which $BCl_3$ and $O_2$ are enclosed in the process chamber 201 is maintained for a predetermined time, for example, 180 sec. Further, in the etching process, as described above, when the inner pressure of the process chamber 201 reaches the second pressure, $BCl_3$ and $O_2$ are not enclosed with all of the valves being closed, and, when $BCl_3$ and $O_2$ flow by opening the valves 231a, 344, 334, and 354, by controlling the valve 231a, $BCl_3$ and $O_2$ may be continuously supplied for a predetermined time so as to become the second pressure.

Residual Gas Removing Process (Step 24)

After a predetermined time elapses, the valve 231a is opened, and the inside of the process chamber 201 is vacuum-exhausted through the exhaust pipe 231. Subsequently, the valves 524 and 534 are opened, and gas purging in the process chamber 201 is performed by exhausting the inside of the process chamber 201 through the exhaust pipe 231 while supplying an inert gas, such as $N_2$ or the like, into the process chamber 201.

The steps 21 through 24 are set as one cycle, and cleaning by cycle etching is performed by repeating the cycle a predetermined number of times. Like this, in cleaning, a step that closes the valve 231a for a predetermined time and a step that opens the valve 231a for a predetermined time are repeated a predetermined number of times. That is, opening/closing of the valve 231a is intermittently repeated a predetermined number of times. According to the cleaning by the cycle etching, by previously checking an etching amount per one cycle, the etching amount may be controlled by the number of cycles. Further, a consumption amount of a gas can be lower than a method that performs cleaning by continuously flowing an etching gas. Further, the enclosing process of the step 23 may be skipped.

$BCl_3$ and $O_2$ introduced into the process chamber 201 are overall diffused in the process chamber 201, and contact a deposit including a $ZrO_2$ film adhered to the inside of the process chamber 201, namely, the inner wall of the inner tube 204 or the boat 217. A thermochemical reaction occurs between the deposit and $BCl_3$ and $O_2$ to generate a reaction product. The generated reaction product is exhausted to outside the process chamber 201 through the exhaust pipe 231 Like this, the deposit is removed (etched), and the cleaning the process chamber 201 is performed.

When the cycle is performed a predetermined number of times, the inside of the process chamber is vacuum-sucked, and then, the inside of the process chamber 201 is purged by exhausting the inside of the process chamber 201 while supplying $N_2$ into the process chamber 201. For example, the inside of the process chamber 201 is exhausted for 180 sec. The inside of the process chamber 201 is purged, and then replaced with $N_2$.

Moreover, as processing conditions of the cleaning by the cycle etching,

Processing temperature: 500 to 850 degrees C., preferably 540 degrees C.,

First pressure: 10 Pa or less, preferably 1 Pa,

Second pressure: 10 to 26,600 Pa, preferably 13,300 Pa,

Flow rate of supplied $BCl_3$: 0.5 to 5 slm, preferably 1 slm,

Flow rate of supplied $O_2$: 0 to 0.04 slm, preferably 0.02 slm,

Gas supply time [shift time]: 0.1 to 15 min, preferably 4.5 min (270 sec),

Gas enclosing time (enclosing time): 0.1 to 15 min, preferably 3 min (180 sec),

Exhaust time: 0.1 to 10 min, preferably 3 min (180 sec), and

Number of cycles: 1 to 100 are exemplarily set, and, by maintaining each of the cleaning conditions as a constant value within a corresponding range, the cleaning is performed.

It can be seen in FIG. 1B that the Zr element, which is the deposited film of the inner wall of the nozzle 420 supplying TEMAZr into the process chamber 201, is efficiently removed, and thus, a zirconium dioxide film ($ZrO_2$ film) is removed by the gas cleaning, but segregated into the zirconium oxide film containing carbon (C) by 60%.

Even after the above-described cleaning process is performed, a deposited film may remain at each of the inner walls of the nozzles 410, 420, and 430. The deposited film is a $ZrO_2$ film including Zr-N bonding and Zr-C bonding which obstruct etching. The Zr-N bonding and Zr-C bonding which obstruct etching are broken, and, in a later-described second cleaning, the deposited film adhered to the inside of the inner tube 204 or each of the insides of the nozzles 410, 420, and 430 is modified with ZrOx and $CO_2$ for gasifying the deposited film into $ZrCl_x$. Hereinafter, for example, a modification process that oxidizes the $ZrO_2$ film remaining in each of inner walls of the nozzles 410, 420, and 430 with $H_2$ and $O_2$ will be described with reference to FIGS. 6 and 9.

The process chamber 201 is purged after the cleaning process, and then the inside of the process chamber 201 is vacuum-exhausted by the vacuum pump 231c so as to have a desired processing pressure (vacuum level). At this point, an inner pressure of the process chamber 201 is measured by the pressure sensor 245, and the APC valve 231a is feedback controlled based on the measured pressure. Further, the inside of the process chamber 201 is heated by the heater 207 so as to have a desired temperature. At this point, in order for the inside of the process chamber 201 to have a desired temperature distribution, an electrical connection state to the heater 207 is feedback controlled based on temperature information detected by the temperature sensor 263. Subsequently, the rotary mechanism 254 rotates the boat 217. However, the boat 217 doesn't have to be rotated.

A temperature in the process chamber 201 is 400 degrees C. to 800 degrees C., and for example, may be held as 540 degrees C. When a temperature in the process chamber 201 reaches 540 degrees C. and a temperature and the like are stabilized, subsequent processing is performed with the temperature being held as 540 degrees C. Further, an inner pressure of the process chamber 201 is 0.5 to 760 Torr.

$H_2$ and $O_2$ Supplying Process (Step 31)

By opening the valves 314, 334, and 354, $H_2$ flows in the gas supply pipe 310, and $O_2$ flows in the gas supply pipe 330. $H_2$ is adjusted in flow rate by the mass flow controller 312, and supplied into the process chamber 201 through the gas supply hole 410a of the nozzle 410. $O_2$ is adjusted in flow rate by the mass flow controller 332, and supplied into the process chamber 201 through the gas supply hole 430a of the nozzle 430.

$H_2$ and $O_2$ are mixed with each other in the process chamber 201 to become $H_2O$ and atomic oxygen, and carbon (C) contained in the deposited film adhered to each of the insides of the nozzles 410, 420, and 430 reacts with the atomic oxygen to generate carbon monoxide (CO), carbon dioxide ($CO_2$), etc., which are exhausted to outside the process chamber 201.

Residual Gas Removing Process

After a predetermined time elapses, the valves 314, 335, and 354, and the supply of $H_2$ and $O_2$ is suspended. Further, with the valve 231a of the gas exhaust pipe 231 being opened, the process chamber 201 is exhausted to 20 Pa or less by the vacuum pump 231c, thereby removing residual $H_2$ and $O_2$ from the process chamber 201. Further, at this point, an inert gas such as $N_2$ or the like is supplied into the process chamber 201 through the gas supply pipes 510, 520, and 530 to purge the process chamber 201, thereby more increasing the removal effect of residual $H_2$ and $O_2$.

Moreover, as processing conditions of the modification,

Processing temperature: 400 degrees C. to 800 degrees C., preferably 540 degrees C., Pressure in supplying $H_2$ and $O_2$: 20 to 500 Pa, preferably 200 Pa, Pressure in exhausting: 1 to 20 Pa, preferably 10 Pa, Flow rate of supplied $H_2$: 0.5 to 20 slm, preferably 2 slm, Flow rate of supplied $O_2$: 0.5 to 20 slm, preferably 2 slm, Gas supply time: 0.1 to 15 min, preferably 10 min (600 sec), Exhaust time: 0 to 10 min, preferably 1 min, and Number of cycles: 1 to 12 are exemplarily set, and, by maintaining each of the modifying conditions as a constant value within a corresponding range, modification processing is performed.

Figure 2A:
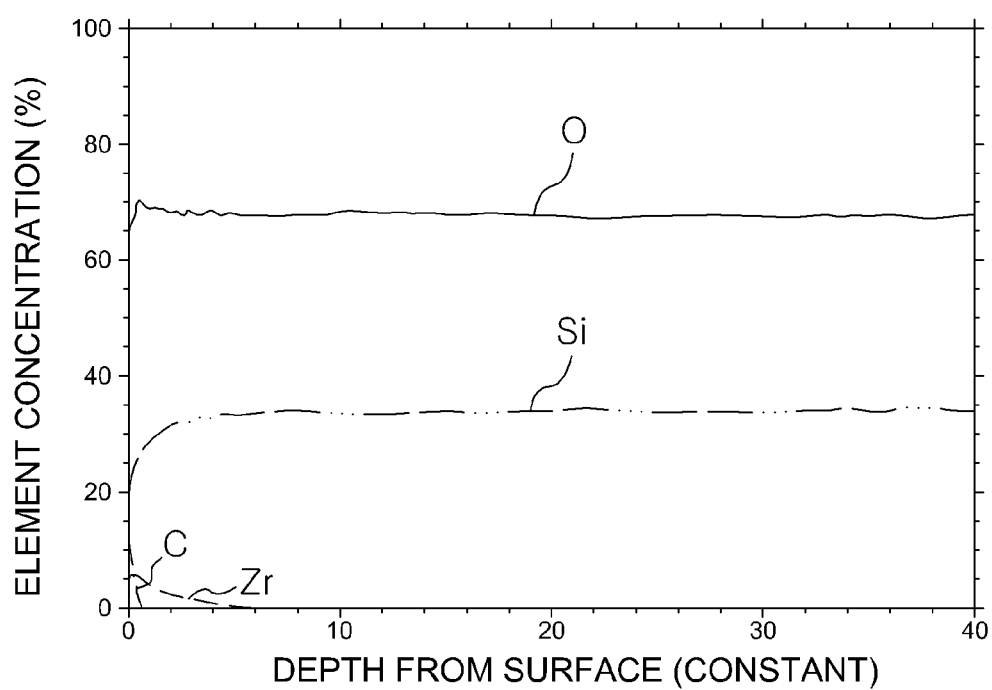
FIG. 2A is a view showing a composition of a film adhered to the inner wall of the nozzle according to an embodiment of the present invention, showing a composition of a film of the inner wall of the nozzle after modification.

FIG. 2A shows a result in which a depth-direction film composition of a deposited film, adhered to an inner wall of a nozzle before the modification process is performed, is analyzed by the X-ray photoelectron spectroscopy (XPS). It can be seen in FIG. 2A that a C element, which is the deposited film of the inner wall of the nozzle supplying TEMAZr into the process chamber 201, is mostly removed.

Even if a deposited film including Zr-N bonding and Zr-C bonding remains on the inner wall of the reaction tube defining the process chamber 201 and a member disposed in the process chamber 201 similarly to the nozzle 420 after the first cleaning, $H_2$ and $O_2$ are mixed with each other in the process chamber 201 to become $H_2O$ and atomic oxygen in the modification process, and thus, carbon (C) reacts with the atomic oxygen to generate carbon monoxide (CO), carbon dioxide ($CO_2$), etc., which are exhausted to outside the process chamber 201. Accordingly, when a processing gas containing an organic compound, such as TEMAZr or the like, is supplied into the process chamber 201, a C element contained in a film, which is adhered to the inner wall of the reaction tube defining the process chamber 201 and a member disposed in the process chamber 201, is also removed efficiently.

(4) Second Cleaning Process

Figure 2B:
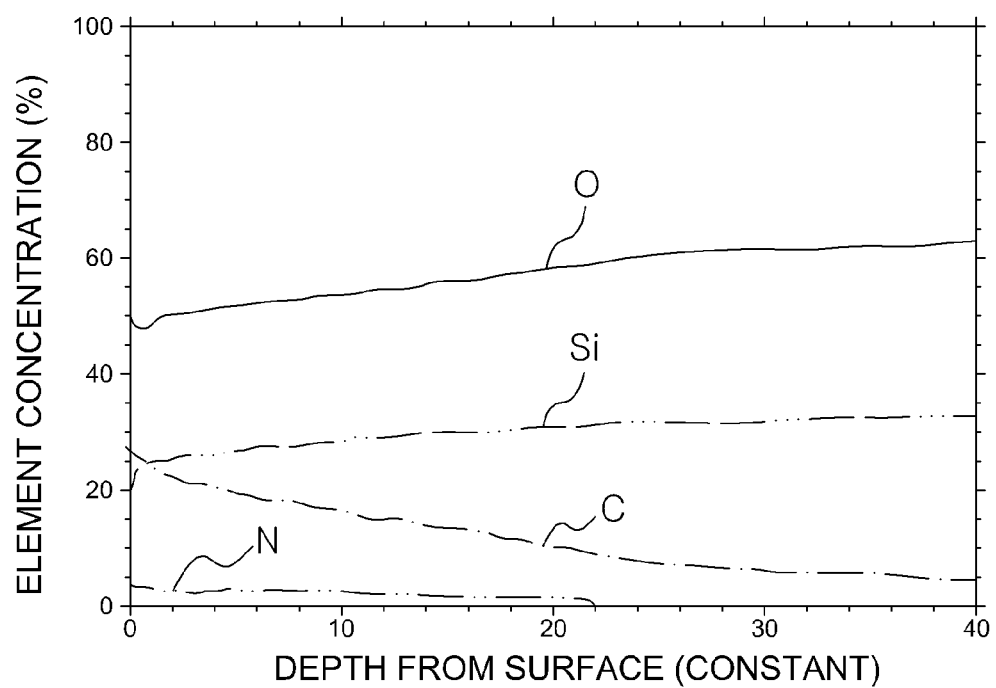
FIG. 2B is a view showing a composition of a film adhered to the inner wall of the nozzle according to an embodiment of the present invention, showing a composition of a film of the inner wall of the nozzle after second gas cleaning.
Figure 6:
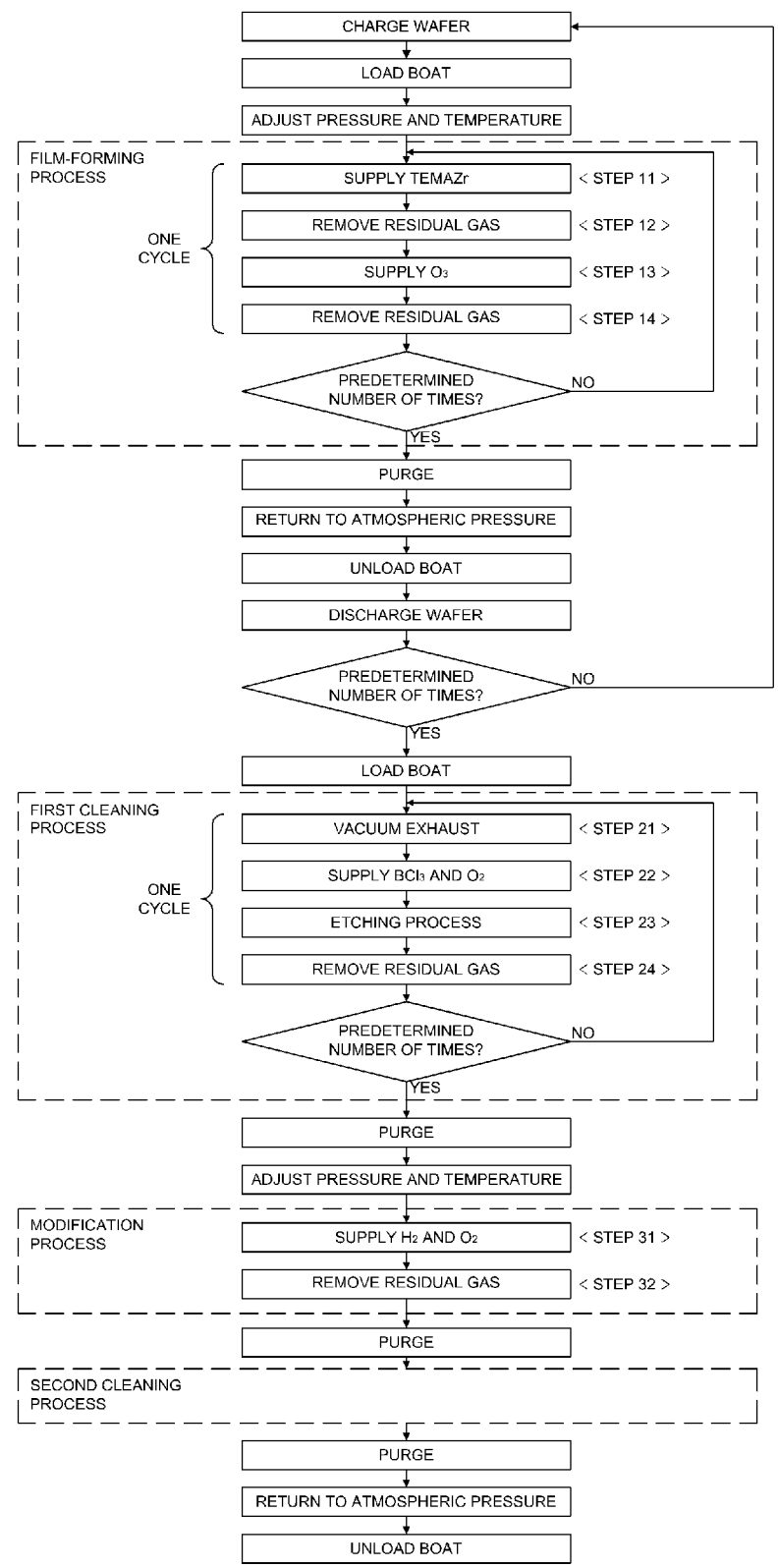
FIG. 6 is a view showing a flowchart of a process according to an embodiment of the present invention.
Figure 8:
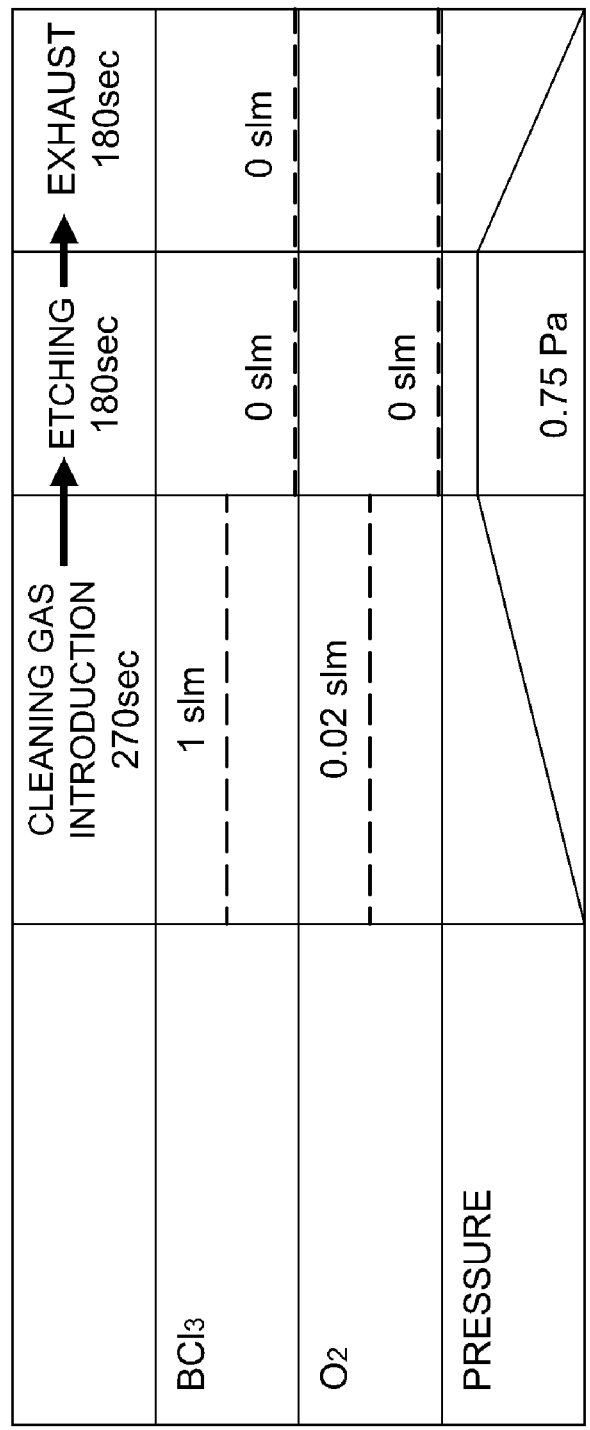
FIG. 8 is a view showing a sequence of a cleaning process according to an embodiment of the present invention.
Figure 12:
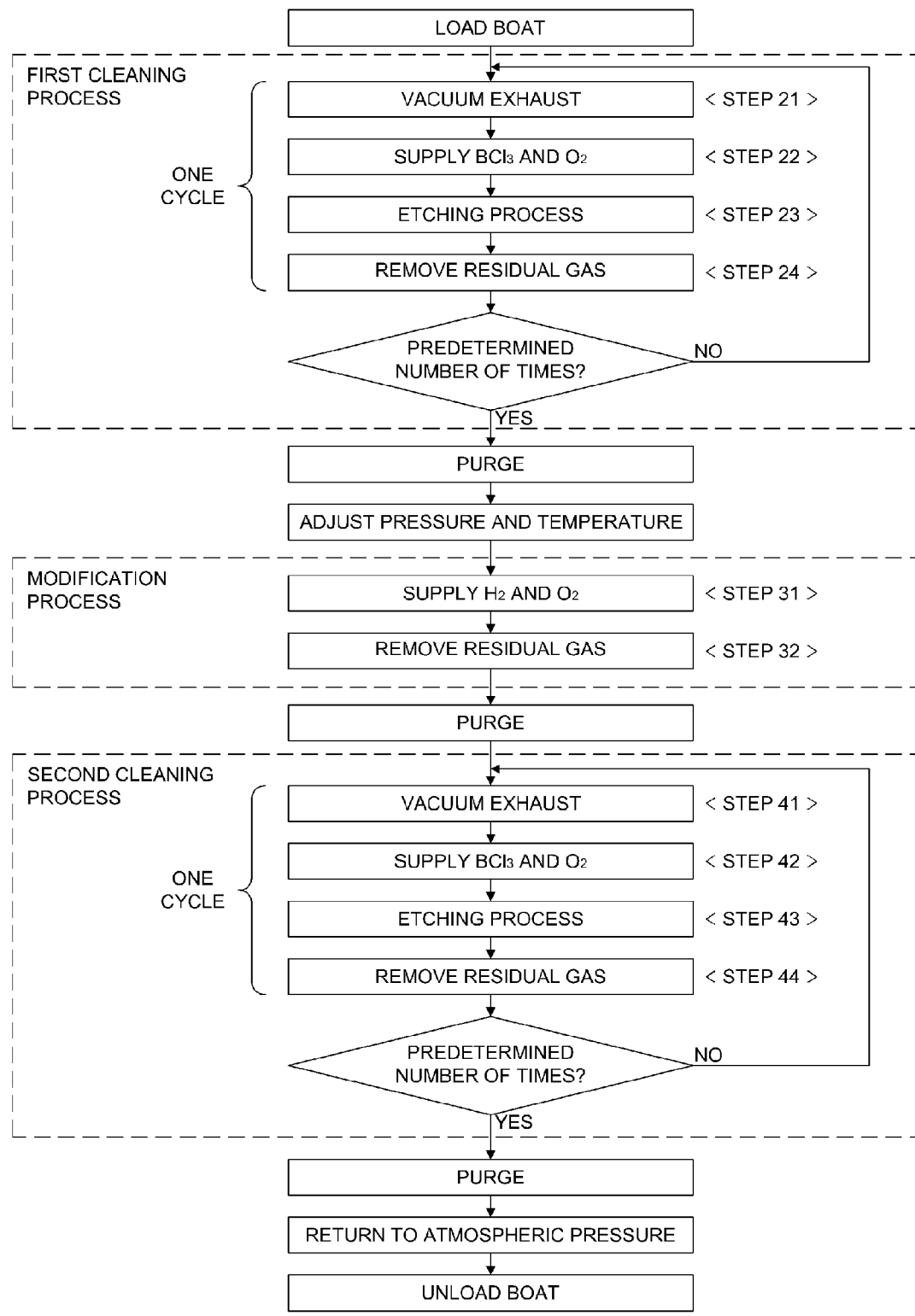
FIG. 12 is a view showing a flowchart of a cleaning process according to an embodiment of the present invention.

After the modification process, the second cleaning process is performed. Here, FIG. 12 is a view showing details of the first and second cleaning processes. As shown in FIG. 12, the second cleaning process is the same as the first cleaning, and therefore, a detailed description on step 41 to step 44 is not provided. A deposited film (ZrO film) containing a Z element remaining in the nozzle 420 is completely removed by the second cleaning process. At this time, the members of the process chamber 201 are not over-etched by an etching rate difference according to an etching selectivity between the deposited film adhered to the inner wall of the nozzle 420 and quartz (SiO) that is a material constituting the boat 217 or the inner tube 204 in the process chamber 201. This is because the second cleaning process has a cleaning condition in which a deposited film (ZrO) is removable and surfaces (SiO) of the respective members configuring the process chamber 201 are not etched. Here, FIG. 2B shows a result in which a depth-direction film composition of a deposited film, adhered to an inner wall of a nozzle before the second cleaning process is performed, is analyzed by the X-ray photoelectron spectroscopy (XPS). It can be seen in FIG. 2B that a Zr element is efficiently removed, and thus, a $ZrO_2$ film, which is the deposited film of the inner wall of the nozzle supplying TEMAZr into the process chamber 201, is removed. Further, in FIG. 2B, although the C element remains, the C element is very small in amount, and there is no possibility of organic pollution. Therefore, as shown in FIGS. 6 and 12, in the embodiment, a process that repeatedly performs modification processing after the second cleaning process is not installed. However, in the embodiment, second modification processing may be performed after the second cleaning process. Further, when the second modification processing is performed, the second modification processing may have the same processing condition as the first modification processing.

When cleaning in the process chamber 201 is ended, the above-described film-forming of a film on the wafer 200 is again performed. That is, the boat 217 with the plurality of wafers 200 charged thereon is loaded into the process chamber 201, a film is formed on each of the wafers 200 by repeating the steps 11 through 14, and the boat 217 with the processed wafer 200 charged thereon is unloaded outward from the process chamber 201. Further, depending on the case, cleaning in the inner tube 204 is again performed.

According to the embodiment, especially, a deposited film remaining in the inner wall of the nozzle 420 after the first gas cleaning can be removed. Specifically, when a processing gas containing an organic compound is supplied into the process chamber 201 via the nozzle 420 (in film-forming process), since the nozzle 420 is disposed in the auxiliary chamber 201a, the processing gas containing the organic compound is heated even in flowing in the nozzle 420 and supplied into the process chamber 201. Thus, the processing gas in the nozzle 420 has a temperature lower than an actual processing temperature (540 degrees C. in the embodiment), and also, an inert gas (carrier gas) is simultaneously supplied, but a slight heat reaction occurs in the nozzle 420. Particularly, unlike the inside of the process chamber 201, since there is no oxidizing agent ($O_3$ in the embodiment), the deposited film (ZrO in the embodiment) adhered to the inner wall of the nozzle 420 includes a C-containing film (ZrO including Z-C bonding). Therefore, in order to remove the film adhered to the inner wall of the nozzle 420, a C element is removed from the residual C-containing film (deposited film containing the C element) by performing modification process, and then, the deposited film is completely removed by performing gas cleaning. Here, the nozzle 420 supplying the processing gas containing the organic compound into the process chamber 201 is configured identically to the nozzle 420 supplying a cleaning gas, and thus, the deposited film (modified by the modification process) adhered to the inner wall of the nozzle 420 can be efficiently removed. Accordingly, the effect of the gas cleaning is sufficiently obtained, and a down time of maintenance or decomposition cleaning is needed compared to conventional wet cleaning, thus enhancing a throughput and reducing the number of workers.

Moreover, according to the embodiment, a selective cleaning is performed by using the difference (i.e., the etching rate difference according to the etching selectivity) between an etching rate of metal oxide of the cleaning gas and an etching rate of quartz (SiO) of the cleaning gas. Thus, the over-etching of the respective members configuring the process chamber can be prevented, and the deposited film remaining in the inner wall of the nozzle after the gas cleaning (first cleaning) can be removed by the selective cleaning (second cleaning). As a result, a maintenance time, such as disassembly and exchange of each of the members [inner tube 204, etc.], can be saved compared to the conventional wet cleaning, thus enhancing an operation rate of an apparatus.

Moreover, according to the embodiment, by supplying an organic compound to form a predetermined film (oxide film), performing the first cleaning process that removes a deposited film (metal oxide film) adhered to an inner wall of a reaction tube configuring a process chamber or a surface of each member disposed in the process chamber, performing the modification process [reducing carbon (C)] that modifies a deposited film (metal oxide film) containing residual carbon (C) with a modifying gas, and performing the second cleaning process that additionally removes the deposited film (metal oxide film), a deposit including high-k films adhered to the inner wall of the reaction tube defining the process chamber, members such as a substrate support, etc. in the process chamber, and an inner wall of a nozzle supplying a processing gas into the process chamber can be efficiently removed. In this way, by performing gas cleaning in two stages including the first cleaning process and second cleaning process, cleaning (removing a deposited film) with no residual film is possible.

Moreover, for example, as supposed in FIGS. 1A and 1B, deposited films (metal oxide film) containing carbon (C) and the like remaining under the cleaning conditions in the embodiment remain in an inner wall (SiO) of a reaction tube configuring a process chamber 201, a surface (SiO) of each member disposed in the process chamber, and a boundary between the inner wall (SiO) of the nozzle 420 and the deposited film (metal oxide film). Accordingly, the first cleaning process removes the deposited films (metal oxide film), containing no carbon (C), adhered to the inner wall of the reaction tube defining the process chamber, the surface of each member disposed in the process chamber 201, and the inner wall of the nozzle 420, the modification process removes a small amount of C element contained in a deposited film (metal oxide film) containing residual carbon (C) and the like, and additional gas cleaning (second cleaning process) is performed, thus efficiently performing the cleaning process.

For example, when deposited films (metal oxide film) containing carbon (C) mostly remain in the inner wall (SiO) of the reaction tube defining the process chamber 201, on the surface (SiO) of each member disposed in the process chamber 201, and at the boundary between the inner wall (SiO) of the nozzle 420 and the deposited film (metal oxide film), the cleaning condition in the embodiment is more effective than a case, in which modification processing is performed before etching processing, in terms of both a cleaning time and cleaning efficiency.

In the embodiment, an example that forms a $ZrO_2$ film as a high-k film has been described above, but the present invention may be applied to a $HfO_2$ film or the like which is formed using a processing gas (for example, TEMAHf and $O_3$) which causes a C element to remain as a deposited film in a process tube. In addition, the present invention may be applied to $AlO_2$, $TiO_2$, or the like that is the high-k film. Further, the present invention is not limited to the high-k film, and for example, may be applied to a predetermined oxide film formed of an organic compound.

Moreover, the cleaning gas is not limited to $BCl_3$, and the present invention may use other cleaning gases such as HF, HCl, $Cl_2$, $SiCl_4$, HBr, $BBr_3$, $SiBr_4$, $Br_2$, etc. Further, a cleaning gas used in the first cleaning process may be the same as or different from a cleaning gas used in the second cleaning process. In gases used in the embodiment, when both the first cleaning process and the second cleaning process use $BCl_3$ and $O_2$ as cleaning gases, an amount of added $O_2$ may not be changed in the two processes. Further, the second cleaning processing condition has no restriction in kind of a cleaning gas, but may be a condition that increases a selectivity of a $ZrO_2$ film and a quartz ($SiO_2$) film. Further, in other gases, a gas supply pipe is additionally required.

Moreover, a gas used in the modification process is not limited to $H_2+O_2$, and may use $H_2O$, $O_2$, NO, $O_3$, etc.

Figure 11:
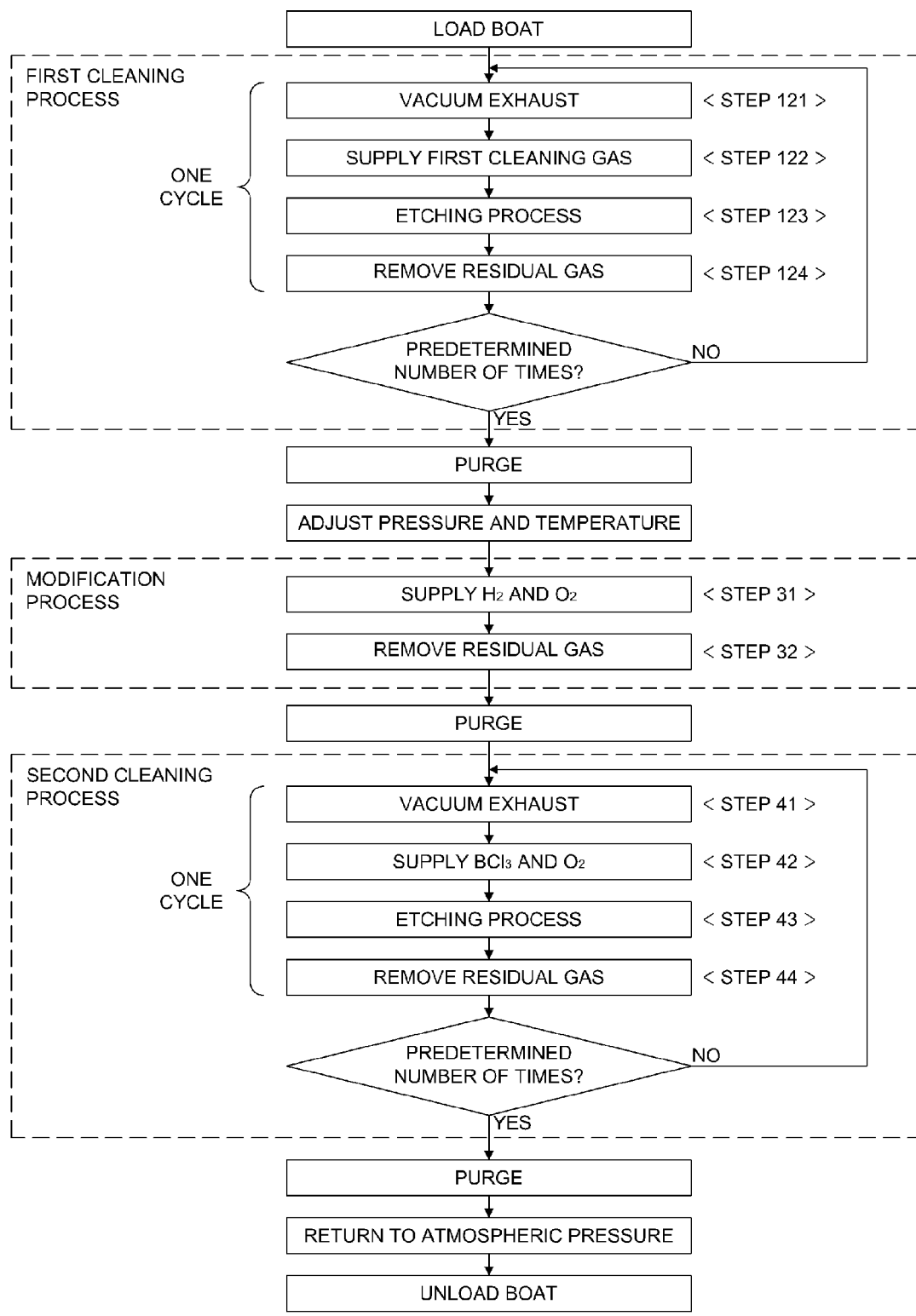
FIG. 11 is a view showing a flowchart of a cleaning process according to an embodiment of the present invention.

Here, when a cleaning gas used in the first cleaning process is different from a cleaning gas used in the second cleaning process, an embodiment will be described with reference to FIG. 11. FIG. 11 shows an embodiment in which HF is used as the first cleaning gas and $BCl_3$ is used as the second cleaning gas, for reducing a damage caused to the inner tube 204 (quartz) or boat 217 (quartz) in the process chamber 201. Further, the film-forming process of FIG. 6 is omitted in FIG. 11.

A difference between a flowchart of FIG. 11 and a flowchart of FIG. 12 is that the first cleaning process uses HF, instead of $BCl_3$, as the first cleaning gas, and thus, only the first cleaning process will now be described.

Vacuum Exhaust Process (Step 121)

The inside of the inner tube 204 [the inside of the process chamber 201] is exhausted by the vacuum pump 231c (pressure adjustment) so as to have a desired pressure (vacuum level). At this point, a degree of valve opening of the APC valve 231a is feedback controlled based on a pressure measured by the pressure sensor 245. An inner pressure of the process chamber 201 reaches a predetermined pressure, and then the APC valve 231a is closed. Further, an electrical flow rate to the heater 207 is adjusted (temperature adjustment) such that a temperature in the process chamber 201 reaches a desired processing temperature. At this point, an electrical connection state to the heater 207 is feedback controlled based on temperature information detected by the temperature sensor 263. Subsequently, the rotary mechanism 254 rotates the boat 217. However, the boat 217 doesn't have to be rotated.

HF Supplying Process (Step 122)

When the APC valve 231a is closed and an inner pressure of the process chamber 201 reaches the first pressure, HF gas is supplied as the first cleaning gas into the process chamber 201 via an HF gas supply pipe (not shown) for a predetermined time. Further, HF may be diluted by opening the valves 524 and 534 and supplying $N_2$ into the process chamber 201. Furthermore, even in the embodiment, similarly to $BCl_3$, a predetermined gas, for example, $H_2O$ or the like, may be added for enhancing an etching rate.

At a time when an inner pressure of the process chamber 201 reaches a predetermined pressure (third pressure), the supply of HF into the process chamber 201 is suspended. At this point, when $N_2$ is supplied, the valves 524 and 534 are closed, and the supply of $N_2$ into the process chamber 201 is also suspended. Thus, the supply system is encapsulated. At this point, all of the valves are closed. That is, both the gas supply system and the exhaust system are encapsulated.

Therefore, the inside of the process chamber 201 is encapsulated, and HF is enclosed in the process chamber 201.

Etching Process (Step 123)

By encapsulating the gas supply system and the exhaust system, the inside of the process chamber 201 is encapsulated, and a state in which HF is enclosed in the process chamber 201 is maintained for a predetermined time. Further, in the etching process, as described above, when the inner pressure of the process chamber 201 reaches a predetermined pressure, HF is not enclosed with all of the valves being closed, and, when HF flows, by controlling the valve 231a, HF may be continuously supplied for a predetermined time so as to become the predetermined pressure.

Residual Gas Removing Process (Step 124)

After a predetermined time elapses, the valve 231a is opened, and the inside of the process chamber 201 is vacuum-exhausted through the exhaust pipe 231. Subsequently, the valves 524 and 534 are opened, and gas purging in the process chamber 201 is performed by exhausting the inside of the process chamber 201 through the exhaust pipe 231 while supplying an inert gas, such as $N_2$ or the like, into the process chamber 201.

The steps 121 through 124 are set as one cycle, and cleaning by cycle etching is performed by repeating the cycle a predetermined number of times. Like this, in cleaning, a step that closes the valve 231a for a predetermined time and a step that opens the valve 231a for a predetermined time are repeated a predetermined number of times. That is, opening/closing of the valve 231a is intermittently repeated a predetermined number of times. According to the cleaning by the cycle etching, by previously checking an etching amount per one cycle, the etching amount may be controlled by the number of cycles. Further, a consumption amount of a gas can be lower than a method that performs cleaning by continuously flowing an etching gas. Further, the enclosing process of the step 123 may be skipped.

HF introduced into the process chamber 201 are overall diffused in the process chamber 201, and contact a deposit including a $ZrO_2$ film adhered to the inside of the process chamber 201, namely, the inner wall of the inner tube 204 or the boat 217. A thermochemical reaction occurs between the deposit and HF to generate a reaction product. The generated reaction product is exhausted to outside the process chamber 201 through the exhaust pipe 231 Like this, the deposit is removed (etched), and the cleaning the process chamber 201 is performed.

When the cycle is performed a predetermined number of times, the inside of the process chamber is vacuum-sucked, and then, the inside of the process chamber 201 is purged by exhausting the inside of the process chamber 201 while supplying $N_2$ into the process chamber 201. For example, the inside of the process chamber 201 is exhausted for 180 sec. The inside of the process chamber 201 is purged, and then converted into $N_2$.

A modification processing and a second cleaning process that are subsequent processes are similar to the modification processing and second cleaning process of FIG. 12, and thus are not described.

In the embodiment, especially, since the first cleaning process uses HF as the cleaning gas, damages of the inner tube 204 and boat 217 due to over-etching can be reduced. Further, since the second cleaning process is performed under a cleaning condition in which an etching selectivity of each of the surface (quartz) of the inner tube 204 and the surface (quartz) of the boat 217 to a deposited film (ZrO in the embodiment) is high, over-etching is prevented in the inner wall (SiO) of the reaction tube defining the process chamber 201 and the surface (SiO) of each member disposed in the process chamber 201, and only the deposited film (ZrO in the embodiment) in the nozzle 420 can be removed.

Also, in the embodiment, although the boat 217 is loaded into the process chamber 201 (boat loading) and then the cleaning process is started, even when the boat 217 is not loaded into the process chamber, the cleaning process in the embodiment may be performed by sealing the process chamber 210.

Moreover, in the embodiment, the first cleaning process and the second cleaning process remove the deposits using a thermochemical reaction of the cleaning gas with the deposits, but are not limited thereto. For example, in at least one of the first cleaning process and the second cleaning process, plasma cleaning that reacts an activated cleaning gas with a deposit to remove the deposit may be performed as the cleaning process in the embodiment.

Furthermore, in the embodiment, the deposited film including the high-k film is removed by performing the gas cleaning in two stages including the first cleaning process and second cleaning process, but the present invention is not limited thereto. For example, a small amount of carbon (C) contained in the deposited film (metal oxide film) may be removed by supplying the modifying gas, and then the gas cleaning may be performed.

For example, when carbon (C) contained in a deposited film (metal oxide film) is overall diffused in the deposited film (metal oxide film), a modification process of reducing carbon (C) contained in the deposited film (metal oxide film) may be performed, and then, the deposited film (metal oxide film) may be removed by carrying out gas cleaning (first cleaning process). In this case, the deposited film (metal oxide film) adhered to the inside of the process chamber 201, namely, the inner wall of the inner tube 204, the boat 217, or the nozzle 420, can be efficiently removed by the two processes, namely, the modification process and the cleaning process. Accordingly, a time taken in maintenance can be considerably saved, and an operation rate of an apparatus can be enhanced.

Moreover, in the embodiments of the present invention, the vertical substrate processing apparatus has been described above as an example, but the present invention may also be applied to other types of substrate processing apparatuses such as a single-wafer type substrate apparatus, a horizontal substrate processing apparatus, etc.

According to the present invention, deposited films adhered to members, such as an inner wall of a reaction tube configuring a process chamber, a substrate support in the process chamber, etc., and an inner wall of a nozzle supplying a processing gas into the process chamber can be efficiently removed.

Exemplary Aspects of the Invention

Hereinafter, exemplary aspects of the present invention will be supplementary noted.

Supplementary Note 1

According to an aspect of the present invention, there is provided a gas cleaning method performed in a substrate processing apparatus, including: a process chamber including a reaction tube configured by an inner tube into which a substrate retainer configured to retain a plurality of substrates are inserted and an outer tube configured to surround the inner tube, and a gas introducing nozzle configured to discharge a gas in parallel to a substrate-plane direction to a substrate; a heating unit configured to heat the substrate; an exhaust system configured to exhaust a gas in the process chamber; and a control unit configured to perform control to form a predetermined oxide film on the substrate, wherein the control unit performs a first process of gas-cleaning an oxide film deposited in the reaction tube, a modification process of reducing carbon (C) in the oxide film, and a second process of gas-cleaning the modified oxide film.

Supplementary Note 2

In the gas cleaning method according to supplementary note 1, the oxide film may be a high-k oxide film formed of zirconium oxide, etc.

Supplementary Note 3

According to another aspect of the present invention, there is provided a method of manufacturing a semiconductor device, including: (a) supplying a processing gas containing an organic compound into a process chamber to form a predetermined film on a substrate; (b) supplying a first cleaning gas into the process chamber with the substrate being unloaded from the process chamber to remove films adhered to an inner wall of a reaction tube defining the process chamber and members disposed in the process chamber; (c) supplying a modifying gas into the process chamber after performing the step (b) to modify a carbon-containing film remaining in a nozzle of the members configured to supply the processing gas; and (d) supplying a second cleaning gas into the process chamber to remove a film obtained by modifying the carbon-containing film in the step (c).

Supplementary Note 4

In the method of manufacturing a semiconductor device according to supplementary note 3, the film may include a metal oxide film.

Supplementary Note 5

In the method of manufacturing a semiconductor device according to supplementary note 3, a cleaning processing condition of the step (b) may be same as that of the step (c).

Supplementary Note 6

In the method of manufacturing a semiconductor device according to supplementary note 5, the first cleaning gas may be same as the second cleaning gas.

Supplementary Note 7

In the method of manufacturing a semiconductor device according to supplementary note 5, each of the first cleaning gas and the second cleaning gas may include $BCl_3$ and $O_2$.

Supplementary Note 8

In the method of manufacturing a semiconductor device according to supplementary note 3, the first cleaning gas may be different from the second cleaning gas.

Supplementary Note 9

In the method of manufacturing a semiconductor device according to supplementary note 3, the first cleaning gas may include HF, and the second cleaning gas may include $BCl_3$ and $O_2$.

Supplementary Note 10

In the method of manufacturing a semiconductor device according to supplementary note 4, the step (c) may be performed under a processing condition where an etching selectivity rate of the metal oxide film is deferent from those of the members.

Supplementary Note 11

In the method of manufacturing a semiconductor device according to supplementary note 3, the modifying gas may include an oxygen-containing gas and a hydrogen-containing gas.

Supplementary Note 12

In the method of manufacturing a semiconductor device according to supplementary note 3, the modifying gas may include $H_2$ and $O_2$.

Supplementary Note 13

In the method of manufacturing a semiconductor device according to supplementary note 3, the nozzle may be provided in plural numbers, and the step (c) may include modifying the carbon-containing film adhered to an inner wall of each nozzle.

Supplementary Note 14

In the method of manufacturing a semiconductor device according to supplementary note 3, a first cleaning process and/or a second cleaning process may include supplying the first cleaning gas or the second cleaning gas to cause an inner pressure of the process chamber to reach a predetermined pressure, suspending supply of the first cleaning gas or the second cleaning gas and exhaust of the reaction tube to enclose the first cleaning gas or the second cleaning gas in the process chamber, and, after a predetermined time elapses, exhausting the inside of the process chamber.

Supplementary Note 15

According to still another aspect of the present invention, there is provided a cleaning method of cleaning an inner wall of a reaction tube and members disposed in a process chamber of the reaction tube having a film containing an organic compound adhered thereto, the method including: (a) supplying a first cleaning gas into the process chamber to clean the inner wall of the reaction tube and the members; (b) supplying a modifying gas into the process chamber after performing the step (a) to modify a carbon-containing film remaining in a nozzle among the members configured to supply a processing gas; and (c) supplying a second cleaning gas into the process chamber to remove a film obtained by modifying the carbon-containing film in the step (b), thereby cleaning an inside of the process chamber.

Supplementary Note 16

According to yet another aspect of the present invention, there is provided a substrate processing apparatus including: a reaction tube configured to form a process chamber processing a substrate; a processing gas supply system configured to supply a processing gas containing an organic compound into the process chamber; a cleaning gas supply system configured to supply a cleaning gas into the process chamber; a modifying gas supply system configured to supply a modifying gas into the process chamber; an exhaust system configured to exhaust the process chamber; and a control unit configured to control the processing gas supply system, the cleaning gas supply system, the modifying gas supply system, and the exhaust system to supply the processing gas containing the organic compound into the process chamber to form a film on the substrate, supply the cleaning gas into the process chamber to clean an inner wall of a reaction tube configuring the process chamber and a member disposed in the process chamber when the substrate is not disposed in the process chamber, supply the modifying gas into the process chamber to modify films remaining in the inner wall of the reaction tube and the member disposed in the process chamber, and supply the cleaning gas into the process chamber to clean the inside of the process chamber.

Supplementary Note 17

According to yet another aspect of the present invention, there is provided a non-transitory computer readable recording medium storing a program that causes a computer to execute a process recipe including a film-forming step of supplying a processing gas containing an organic compound into a process chamber to form a predetermined film on a substrate, the program including: a first cleaning sequence of supplying a first cleaning gas into the process chamber to clean an inner wall of a reaction tube and a member disposed in the process chamber; a modification step of supplying a modifying gas into the process chamber to modify, after the first cleaning step, films remaining in the inner wall of the reaction tube and the member; and a second cleaning step of supplying a second cleaning gas into the process chamber to remove a film modified in the modification step.

Supplementary Note 18

According to yet another aspect of the present invention, there is provided a program including: a first cleaning step of supplying a first cleaning gas into the process chamber to clean an inner wall of a reaction tube and a member disposed in the process chamber; a modification step of supplying a modifying gas into the process chamber to modify, after the first cleaning step, films remaining in the inner wall of the reaction tube and the member; and a second cleaning step of supplying a second cleaning gas into the process chamber to remove a film modified in the modification step.

Supplementary Note 19

According to yet another aspect of the present invention, there is provided a method of manufacturing a semiconductor device, including: a film-forming process of supplying a processing gas containing an organic compound into a process chamber to form a predetermined film on a substrate; a first cleaning process of supplying, when the substrate is unloaded from the process chamber, a first cleaning gas into the process chamber to remove films adhered to an inner wall of a reaction tube configuring the process chamber and a member disposed in the process chamber; a modification process of supplying a modifying gas into the process chamber to modify, after the first cleaning process, films remaining in the inner wall of the reaction tube and the member; and a second cleaning process of supplying a second cleaning gas into the process chamber to remove a film modified in the modification process.

Supplementary Note 20

According to yet another aspect of the present invention, there is provided a cleaning method of cleaning an inner wall of a reaction tube, to which a film formed of an organic compound is adhered, including: a first cleaning process of supplying a first cleaning gas into a process chamber including the reaction tube to clean the inner wall of the reaction tube; a modification process of supplying a modifying gas into the process chamber to modify, after the first cleaning process, films remaining in the process chamber; and a second cleaning process of supplying a second cleaning gas into the process chamber to remove a film modified in the modification process to clean the inside of the process chamber.

Supplementary Note 21

According to yet another aspect of the present invention, there is provided a substrate processing apparatus including: a reaction tube configured to form a process chamber processing a substrate; a processing gas supply system configured to supply a processing gas containing an organic compound into the process chamber; a cleaning gas supply system configured to supply a cleaning gas into the process chamber; a modifying gas supply system configured to supply a modifying gas into the process chamber; an exhaust system configured to exhaust the process chamber; and a control unit configured to control the processing gas supply system, the cleaning gas supply system, the modifying gas supply system, and the exhaust system to supply the processing gas containing the organic compound into the process chamber to form a film on the substrate, supply the cleaning gas into the process chamber to clean an inner wall of a reaction tube configuring the process chamber and a member disposed in the process chamber when the substrate is not disposed in the process chamber, supply the modifying gas into the process chamber to modify films remaining in the inner wall of the reaction tube and the member disposed in the process chamber, and supply the cleaning gas into the process chamber to clean the inside of the process chamber.

Supplementary Note 22

According to yet another aspect of the present invention, there is provided a non-transitory computer readable recording medium storing a program that causes a computer to execute a process recipe including a film-forming sequence of supplying a processing gas containing an organic compound into a process chamber to form a predetermined film on a substrate, the program including: a first cleaning step of supplying a first cleaning gas into the process chamber to clean an inner wall of a reaction tube and a member disposed in the process chamber; a modification step of supplying a modifying gas into the process chamber to modify, after the first cleaning step, films remaining in the inner wall of the reaction tube and the member; and a second cleaning step of supplying a second cleaning gas into the process chamber to remove a film modified in the modification step.

What is claimed is:

1. A method of manufacturing a semiconductor device, comprising:
   (a) supplying a processing gas containing an organic compound into a process chamber to form a predetermined film on a substrate;
   (b) supplying a first cleaning gas into the process chamber with the substrate unloaded from the process chamber to remove a metal oxide film adhered to an inner wall of a reaction tube defining the process chamber and members disposed in the process chamber by a thermochemical reaction between the metal oxide film and the first cleaning gas;
   (c) supplying a modifying gas including an oxygen-containing gas and a hydrogen containing gas into the process chamber after performing (b) while maintaining an inner pressure of the process chamber at a predetermined pressure for a time duration longer than that of (b) to modify a carbon-containing film remaining on an inner wall of a nozzle of the members configured to supply the processing gas into the metal oxide film by a thermochemical reaction between the carbon-containing film and atomic oxygen generated from the oxygen-containing gas; and
   (d) supplying a second cleaning gas into the process chamber under a condition where an etching rate of a film obtained by modifying the carbon-containing film in (c) is higher than those of the reaction tube and the members to remove the film by a thermochemical reaction between the second cleaning gas and the film.

2. The method of claim 1, wherein (b) comprises:
   (b-1) enclosing the first cleaning gas in the process chamber by suspending a supply and an exhaust of the first cleaning gas after the inner pressure of the process chamber reaches a predetermined pressure; and
   (b-2) exhausting an inside of the process chamber when a predetermined time elapses after performing (b-1).

3. The method of claim 2, wherein (c) comprises:
   (c-1) enclosing the second cleaning gas in the process chamber by suspending a supply and an exhaust of the second cleaning gas after the inner pressure of the process chamber reaches the predetermined pressure; and
   (c-2) exhausting the inside of the process chamber when a predetermined time elapses after performing (c-1).

4. The method of claim 1, wherein (c) comprises:
   (c-1) enclosing the second cleaning gas in the process chamber by suspending a supply and an exhaust of the second cleaning gas after the inner pressure of the process chamber reaches the predetermined pressure; and
   (c-2) exhausting the inside of the process chamber when a predetermined time elapses after performing (c-1).

5. The method of claim 1, wherein a cleaning processing condition of (b) is same as that of (c).

6. The method of claim 5, wherein the first cleaning gas is same as the second cleaning gas.

7. The method of claim 5, wherein each of the first cleaning gas and the second cleaning gas comprises $BCl_3$ and $O_2$.

8. The method of claim 1, wherein the oxygen-containing gas and the hydrogen containing gas are supplied through nozzles different from a nozzle configured to supply the processing gas.

9. The method of claim 1, wherein a carbon element from the carbon-containing film is removed in (c).

10. The method of claim 1, wherein CO and $CO_2$ are generated by the thermochemical reaction between the carbon-containing film and the atomic oxygen in (c).

11. The method of claim 1, wherein the predetermined pressure ranges from 20 Pa to 500 Pa.

12. The method of claim 1, wherein the time duration of (c) ranges from 0.1 to 15 minutes.

13. The method of claim 1, wherein each of the first cleaning gas and the second cleaning gas is selected from a group consisting of $BCl_3$, HF, HCl, $Cl_2$, $SiCl_4$, HBr, $BBr_3$, $SiBr_4$ and $Br_2$.

14. The method of claim 1, wherein the modifying gas is selected from a group consisting of $H_2+O_2$, $H_2O$, $O_2$, NO and $O_3$.

15. The method of claim 1, wherein the predetermined film formed in (a) is selected from a group consisting of $ZrO_2$ film, $HfO_2$ film, $AlO_2$ film and $TiO_2$ film.

\* \* \* \* \*